(12) United States Patent
Mizugaki

(10) Patent No.: US 6,493,281 B2
(45) Date of Patent: Dec. 10, 2002

(54) SEMICONDUCTOR DEVICE, METHOD FOR REFRESHING THE SAME, SYSTEM MEMORY, AND ELECTRONICS APPARATUS

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/945,651

(22) Filed: Sep. 5, 2001

(65) Prior Publication Data

US 2002/0027235 A1 Mar. 7, 2002

(30) Foreign Application Priority Data

Sep. 5, 2000 (JP) ........................................ 2000-268275

(51) Int. Cl.$^7$ ................................................ G11C 7/00
(52) U.S. Cl. ................ 365/222; 365/230.03; 365/233.5
(58) Field of Search ............................ 365/222, 230.03, 365/149, 233.5

(56) References Cited

U.S. PATENT DOCUMENTS 4,933,907 A * 6/1990 Kumanoya et al. ......... 365/222
5,075,886 A * 12/1991 Isobe et al. ................. 365/194
6,275,437 B1 * 8/2001 Kim et al. ................... 365/222

OTHER PUBLICATIONS

U.S. patent application Ser. No. 09/907,769, Mizugaki, filed Jul. 19, 2001.
U.S. patent application Ser. No. 09/907,755, Mizugaki, filed Jul. 19, 2001.

* cited by examiner

Primary Examiner—Son Mai
(74) Attorney, Agent, or Firm—Oliff & Berridge, PLC

(57) ABSTRACT

The invention provides a semiconductor device that includes a memory cell array that is divided into four blocks. During a period in which data is read or written in one of the blocks, refreshing is conducted in all of the other remaining blocks. An ATD signal triggers a series of operations that are performed when a memory cell is read or written. Refreshing is conducted based on the ATD signal.

15 Claims, 16 Drawing Sheets

SEMICONDUCTOR DEVICE, METHOD FOR REFRESHING THE SAME, SYSTEM MEMORY, AND ELECTRONICS APPARATUS

BACKGROUND OF THE INVENTION

1. Field of Invention

The present invention relates to semiconductor devices that retain data through refreshing, methods of the refreshing, memory systems and electronic apparatuses.

2. Description of Related Art

Currently, the use of VSRAMs (Virtually Static RAMS) as semiconductor memories is well known. Memory cells of a VSRAM are similar to those of a DRAM, with the exception that in a VSRAM, column addresses and row addresses do not need multiplexing. Additionally, a user can use a VSRAM without having to consider refreshing (i.e, refreshing transparency).

SUMMARY OF THE INVENTION

It is an object of the present invention to provide a semiconductor device that retains data through refreshing, a method of the refreshing, a memory system and an electronic apparatus.

A method for refreshing a semiconductor device in accordance with the present invention pertains to a method for refreshing a semiconductor device having a memory cell array that is divided in a plurality of blocks. The method can include an operation step of placing the semiconductor device in an operation state, a first detection signal generation step of generating a first detection signal that is a detection signal representative of a change of an address signal of the semiconductor device during the operation state, and a first refreshing step of conducting refreshing, based on the first detection signal, for blocks among the plurality of blocks other than a block that is externally accessed.

In accordance with the present invention, while a block to be external accessed is being externally accessed, refreshing is conducted for blocks to be refreshed, such that the semiconductor device can be effectively operated. Also, in accordance with the present invention, refreshing can be performed without relying on clocks.

The first detection signal may include, for example, an ATD (Address Transition Detector) signal.

With respect to the address signal, for example, an address signal externally input in a semiconductor device can be used as an address signal as it is. Also, the externally input address signal may be converted to a block address signal, a column address, or a row address, which may be then used as an address signal.

The number of blocks to be externally accessed may be one or greater. The number of blocks to be externally accessed may be determined when a semiconductor device is designed.

Conducting refreshing for a block can mean, for example, to conduct refreshing for memory cells in a certain row in the block. The row may be one row or plural rows. They can be optionally determined when a semiconductor device is designed.

External access can mean, for example, to read data from or write data in a memory cell.

The method for refreshing a semiconductor device in accordance with the present invention can be made as follows. The first refreshing step can further include a first refreshing request step of generating a refreshing request for each of the plurality of blocks based on the first detection signal and a first mesh execution step of conducting refreshing, based on the first refreshing request, for the block among the plurality of blocks other than the block to be accessed.

The method for refreshing a semiconductor device in accordance with the present invention can be made as follows. The method can include an external access execution step of eternally accessing the block to be eternally accessed, wherein the external access execution step is synchronized with the first refresh execution step based on the first detection signal. As a result when a certain block is to be externally accessed, the access to the block if being refreshed can be prevented The method for refreshing a semiconductor device in accordance with the present invention can be made as follows. The first refresh execution step can be completed during a period between generation of the first detection signal and generation of a next detection signal. As a result, when a certain block is to be externally accessed, the block is not in a refreshing state, and therefore the external access cannot be delayed.

The method for refreshing a semiconductor device in accordance with the present invention can be made as follows. The method can include a standby step of placing the semiconductor device in a standby state, a second detection signal generation step of generating a second detection signal that is a detection signal representative of a change of an address signal of another semiconductor device, and a second refreshing step of conducting refreshing for the plurality of blocks based on the second detection signal.

As a result, refreshing can be conducted for the plurality of blocks based on the second detection signal without using a clock even when the semiconductor device is in the standby state.

It is noted that the second detection signal may include a signal that is generated by flowing an address signal of another semiconductor device in a circuit that generates a first detection signal. Accordingly, when a first detection signal is an ATD signal, a second detection signal is an ATD signal.

The method for refreshing a semiconductor device in accordance with the present invention can be made as follows. The second detection signal can be generated during a part of the standby state of the semiconductor device. As a result, the frequency of generating second detection signals can be reduced, such that lower power consumption of the semiconductor device can be achieved.

A semiconductor device in accordance with the present invention can include a memory cell array that is divided into a plurality of blocks, a detection signal generation circuit that generates a detection signal that is a signal representative of a change of an address signal, and a refreshing control circuit that conduct refreshing, based on the fist detection signal, for a block among the plurality of blocks other than a block that is externally accessed.

In accordance with the present invention, the same things as described above can be said. It is noted that the detection signal is the same as the above-described first detection signal or the second detection signal. Also, the detection signal generation circuit includes, for example, an ATD signal generation circuit.

The semiconductor device in accordance with the present invention can be made as follows. The refreshing control circuit can include a plurality of refresh request signal generation circuits, each being provided for each of the plurality of blocks for generating a refresh request signal for each of the plurality of blocks, and a plurality of block controls, each being provided for each of the plurality of blocks for generating, based on the refresh request signal, a refresh execution signal for a block among the plurality of blocks other than a block to be externally accessed.

The semiconductor device in accordance with the present invention can be made as follows. A block control among the plurality of block controls corresponding to the block to be externally accessed generates an external access execution signal for the block to be externally accessed, and the plurality of block controls synchronize, based on the detection signal, generation of the external access execution signal with generation of the refresh execution signal.

The semiconductor device in accordance with the present invention can be made as follows. The semiconductor device can be equipped with an address buffer that receives an input of the address signal, and an address buffer control circuit that controls the address buffer such that an address signal of another semiconductor device can be input in the semiconductor device during the standby state of the semiconductor device.

The semiconductor device in accordance with the present invention can be made as follows. The semiconductor device can include a refresh timing signal generation circuit that generates a refresh timing signal, wherein each of the plurality of refresh request signal generation circuits generates the refresh request signal based on the refresh timing signal for each of the corresponding plurality of blocks.

The semiconductor device in accordance with the present invention can be made as follows. During the standby state of the semiconductor device, the address buffer control circuit controls the address buffer based on the refresh timing signal that is non-active such that an address signal of the other semiconductor device can be input in the semiconductor device. As a result, the frequency of generating detection signals can be reduced during the standby state of the semiconductor device, such that lower power consumption of the semiconductor device can be achieved.

The semiconductor device in accordance with the present invention can be made as follows. The semiconductor device can include a block selection signal generation circuit that generates a block selection signal that selects the block to be externally selected for each of the plurality of blocks, wherein tie block selection signal generation circuit renders all the block selection signals to be non-active during the standby state of the semiconductor device. As a result, during the standby state of the semiconductor device, refresh execution signals can be generated for all of the blocks, and therefore refreshing can be conducted for all of the blocks.

A memory system in accordance with the present invention can include the semiconductor device described above and the other semiconductor device that commonly use a bus line for the address signal. In accordance with the present invention, even during a standby state of the semiconductor device, an address signal of another semiconductor device can be input in the semiconductor device. Therefore, even during the standby state of the semiconductor device, refreshing of the semiconductor device can be conducted.

Additionally, the above described semiconductor devices can be included in an electronic apparatus in accordance with the present invention.

BRIEF DESCRIPTION OF THE DRAWINGS

The invention will be described in connection with the following figures, wherein like numerals represent like elements, and wherein.

DETAILED DESCRIPTION OF PREFERRED EMBODIMENTS

Figure 1:
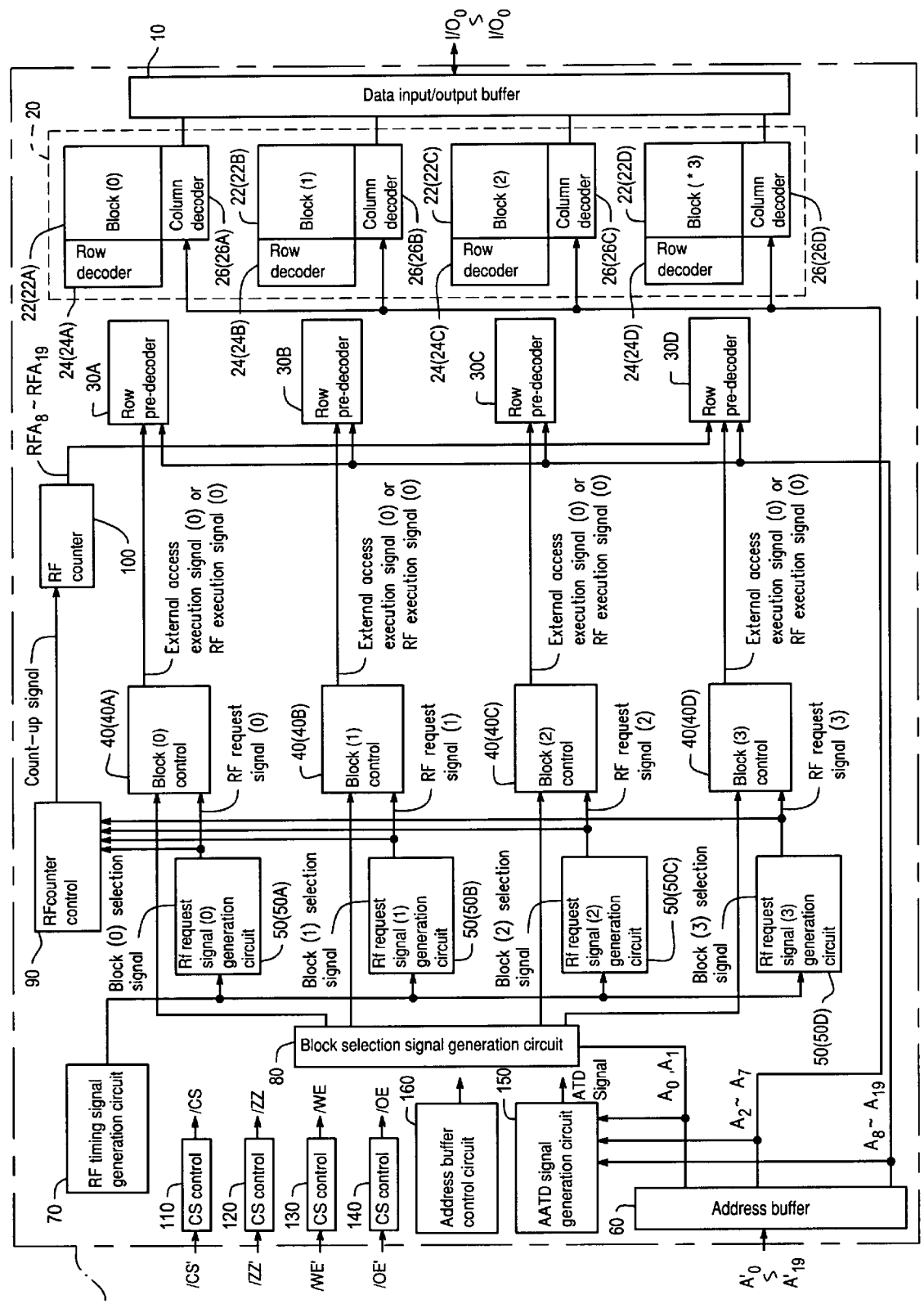
FIG. 1 shows an exemplary circuit block diagram of a semiconductor device in accordance with one embodiment of the present invention.

FIG. 1 shows an exemplary circuit block diagram of a semiconductor device in accordance with an embodiment of the present invention. Each of the blocks described in greater detail below.

A data input/output buffer 10 receives an input of or outputs data in 16 bits (I/O$_0$~I/O$_{15}$).

A memory cell array 20 includes a plurality of memory cells disposed in an array. The memory cell can include an access transistor that is an n-type MOS transistor and a capacitor for retaining data. The memory cell array 20 is divided into four blocks 20 in other words, a block (0) 22A, a block (1) 22B, a block (2) 22C and a block (3) 22D. For example, when the memory cell array 20 retains 16 Mbit, each of the blocks 22 retains for example 4 Mbit. It is noted that, in accordance with the present invention, the memory cell array 20 may be divided into two or more blocks without departing from the spirit and scope of the present invention. The number of the blocks may be an odd number or an even number.

Each of the blocks 22 can be equipped with a plurality of word lines; a plurality of bit line pairs crossing these word lines, and the above-described memory cells provided at intersections of the words lines and the bit line pairs. The word lines correspond respectively to the memory cells in each of the rows in the block. In other words, when a specified word line is selected, those of the memory cells in a row corresponding to the word line are selected.

Each of the blocks 22 can further be equipped with a row decoder 24 and a column decoder 26. The word lines are selected by the row decoder 24. The bit line pairs are selected by the column decoder 26.

Address signals A'0~A'19 for external accesses (for example, for reading or writing) are externally input in an address buffer 60. The address signals A'0 and A'1 are allocated to block address signals A0 and A1. In other words, the address signal A'0 at the least significant level is allocated to the block address signal A0. The address signal A'1 that is at one level higher than the least significant level is allocated to the block address signal A1. Those of the blocks 22 in which memory cells to be externally accessed are disposed are selected based on the block address signals A0 and A1.

The address signals A'2~A'7 are allocated to column address signals A2–A7. The column address signals A2–A7 are input in column decoders 26A–26D. Those of the column addresses in each of the blocks 22 are selected based on the column address signals A2–A7.

The address signals A'8~A'19 are allocated to row address signals A8–A19. The row address signals A8–A19 are input in row pre-decoders 30A–30D and are described below in greater detail. Those of the row addresses in each of the blocks 22 are selected based on the row address signals A8–A19. It is noted that the address signals A'0~A'19 ate allocated to the block address signals, the column address signals and the row address signals in this order. However, it is to be understood that the address signals can be allocated in a different order. The address buffer 60 will be described below in greater detail.

An address buffer control circuit 160 outputs an address buffer control signal. The address buffer control signal is input in the address buffer 60. The address buffer control signal controls such that the external address signals A'$_0$~A'$_{19}$ are allowed or not allowed to enter the semiconductor device 1 through the address buffer 60. The address buffer control circuit 160 will be described below in greater detail.

The block address signals A0 and A1 are input in a block selection signal generation circuit 80. Block (0) selection signal—block (3) selection signal are output from the block selection signal generation circuit 80.

When the block address signals (A0 and A1) are at (L level and L level), respectively, the block selection signal generation circuit 80 outputs the block (0) selection signal at H level (active) and the block (1)–(3) selection signals at L level. Based on the block (0) selection signal at H level, the block (0) 22A is selected.

When the block address signals (A0 and A1) arm at (H level and L level), respectively, the block selection signal generation circuit 80 outputs the block (1) selection signal at H level (active) and the block (0), (2) and (3) selection signals at L level. Based on the block (1) selection signal at H level, the block (1) 22B is selected. When the block address signals (A0 and A1) are at (H level and L level), respectively, the block selection signal generation circuit 80 outputs the block (1) selection signal at H level (active) and the block (0), (1) and (3) selection signals at L level. Based on the block (2) selection signal at H level, the block (2) 22C is selected.

When the block address signals (A0 and A1) are at (L level and H level), respectively, the block selection signal generation circuit 80 outputs the block (3) selection signal at H level (active) and the block (0), (1) and (2) selection signals at L level. Based on the block (3) selection signal at H level, the block (3) 22D is selected. It is noted that the block selection signal generation circuit 80 is described below in greater detail.

The block address signals A0 and A1, the column addresses A2–A7 and the row addresses A8–A19 output from the address buffer 60 are input in an ATD (Address Transition Detector) signal generation circuit 150. The ATD signal generation circuit 150 is a circuit that generates an ATD signal in a pulse-shape at each change among the signals A0–A19. While the same address is being selected, an ATD signal is not generated. The ATD signal triggers a series of operations to be executed when memory cells are externally accessed (for example, for reading or writing), in other words, selection of a word line, selection of a bit line pair, and data reading control or data writing control. In accordance with one of the features of the present embodiment, the memory cells are refreshed based on the ATD signal. It is noted that the ATD signal generation circuit 150 is described below in greater detail.

A RF (refresh) timing signal generation circuit 70 can include a ring oscillation circuit and generates a RF (refresh) timing signal. The RF timing signal generation circuit 70 periodically makes the RF timing signal at H level (active). Based on the RF timing signal at H level, a RF (refresh) request signal to be described next is periodically made at H level (active).

RF (refresh) request signal generation circuit 50 can be provided for each of the blocks 22. Accordingly, in the present embodiment, four RF request signal generation circuits 50. In other words, a RF request signal (0) generation circuit 50A, a RF request signal (1) generation circuit 50B, a RF request signal (2) generation circuit 50C, and a RF request signal (3) generation circuits 50D are provided.

The RF timing signal from the RF timing signal generation circuit 70 is input in each of the RF request signal generation circuits 50. The RF request signal generation circuits 50 output RF request signals. More specifically, the RF request signal (0) generation circuit 50A outputs an RF request signal (0), the RF request signal (1) generation circuit 50B outputs an RF request signal (1), the RF request signal (2) generation circuit 50C outputs an RF request signal (2), and the RF request signal (3) generation circuit 50D outputs an RF request signal (3). It is noted that the RF request signal generation circuits 50 are described below in greater detail.

A block control 40 can be provided for each of the blocks 22. Accordingly, the present embodiment is equipped with four block controls 40. In other words, a block (0) control 40A, a block (1) control 40B, a block (2) control 40C and a block (3) control 40D. The block controls 40A–40D receive inputs of the corresponding RF request signal (0)~the RF request signal (3) and the block (0) selection signal—the block (3) selection signal, respectively.

The block controls 40A–40D control external access executions or refresh executions at their corresponding blocks 22A–22D. In other words, the RF request signal (0)~the RF request signal (3) at H level (active) are input in the corresponding block controls 40 at specified timings. Then, a specified one of the block controls 40 (for example, the block (0) control 40A) that receives an input of an active block selection signal (at H level) outputs an external access execution signal at H level (active). Relevant memory cells in the block 22 (for example, the block (0) 22A) corresponding to the specified one of the block controls 40 are externally accessed based on the external access execution signal.

On the other hand, block selection signals at L level (non-active) are input in all of the remaining block controls 40 (for example, the block (1) control 40B, the block (2) control 40C and the block (3) control 40D) As a result, these block controls 40 output refresh execution signals at H level (active). Memory cells in the relevant rows in the blocks 22 (for example, the block (1) 22B, the block (2) 22C and the block (3) 22D) corresponding to the all of the remaining block controls 40 refreshed based on the refresh execution signals. It is noted that the block controls 40 are described below in greater detail.

A RF counter 100 has a structure similar to that of an ordinary counter. The RF counter 100 outputs refresh address signals RFA8–RFA19, and the signals are input in the row pre-decoders 30A–30D. Based on the refresh address signals $RFA_8$–$RFA_{19}$, memory cells in a row to be refreshed in each of the blocks 22 are selected.

The row pre-decoders 30A–30D supply signals for driving word lines to the corresponding row decoders 24A–24D, and perform the following operations. The refresh address signals $RFA_8$–$RFA_{19}$ from the RF counter 100 and the row address signals $A_8$–$A_{19}$ are input in the row pre-decoders 30A–30D. For examples when the block (0) 22A is one of the blocks 22 to be externally accessed, the external access execution signal (0) at H level (active) is input in the row pre-decoder 30A, and the RF execution signals (1)–(3) at H level (active) are input in the row pre-decoders 30B–30D, respectively. As a result, the row pre-decoder 30A supplies to the row decoder 24A a signal for driving a word line that selects memory cells to be externally accessed. On the other hand, the row pre-decoders 30B–30D supply to the row decoders 24B–24D, respectively, signals for driving word lines that select memory cells to be refreshed. It is noted that the row pre-decoders 30A–30D are described in greater detail below.

RF request signal (0)~RF request signal (3) from the RF request signal generation circuit 50 are input in an RF counter control 90. The RF counter control 90 outputs a count-up signal. The count-up signal is input in the RF counter 100 It is noted that the RF counter control 90 is described in greater detail below.

The semiconductor device 1 is equipped with a CS control 110 and ZZ control 120. Before describing the CS control 110 and the ZZ control 120, an operation and a standby are described. The semiconductor device 1 has an operation state and a standby state. In the operation state, external accesses can be made. In the standby state external accesses cannot be made. Accordingly, it is noted that refreshing is performed even in the standby state.

The CS control 110 receives an externally inputted chip select signal /CS' and outputs a chip select signal /CS. The ZZ control 120 receives an externally inputted snooze signal /ZZ' and outputs a snooze signal /ZZ. When the chip select signal /CS is at L level, and the snooze signal /ZZ is at H level, the operation state is provided. When the chip select signal /CS is at H level, and the snooze signal /ZZ is at H level the standby state is provided. When the chip select signal /CS is at H level, and the snooze signal /ZZ is at L level, a power down state is provided. In the power-down state, the current consumption of the semiconductor device 1 goes down to the minimum level. It is noted that the "standby state" can mean a state in which, for example, the system including the semiconductor device 1 is in operation, but the semiconductor device 1 is not selected by the chip select signal /CS. The "power-down" state can mean, for example, a state in which the system including the semiconductor device 1 is in standby.

A WE control 130 receives an externally inputted write enable signal /WE, and outputs a write enable signal /WE. The WE control 130 is described in detail below.

A OE control 140 receives an externally inputted output enable signal /OE', and outputs an output enable signal /OE.

Figure 2:
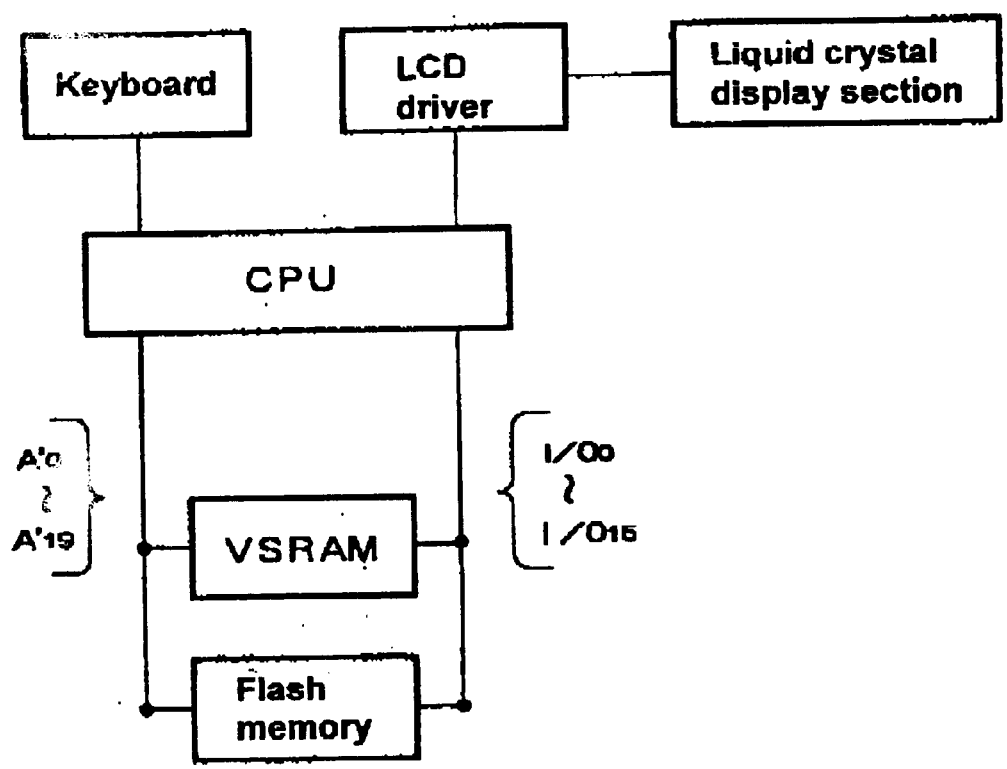
FIG. 2 shows a block diagram in part of a system of a hand-carry telephone equipped with the semiconductor device in accordance with one embodiment of the present invention.

The semiconductor device 1 may be applied to, for example, an electronic apparatus such as a hand-carry equipment FIG. 2 shows a block diagram in part of a system of a hand-carry telephone A VSRAM corresponds to the semiconductor device 1. A CPU, the VSRAM and a flash memory are mutually connected by a bus line that carries the address signals $A'_0$~$A'_{19}$. Also, the CPU, the VSRAM and the flash memory are mutually connected by a bus line that carries data signals $I/O_0$~$I/O_{15}$. Furthermore, the CPU is connected by a bus line to a keyboard and a LCD driver. The LCD driver is connected to a liquid crystal display section by a bus line. The CPU, the VSRAM and the flash memory form a memory system When the VSRAM (semiconductor device 1) is in the operation state, the address signals $A'_0$~$A'_{19}$ for externally accessing the VSRAM are sent from the CPU to the VSRAM. On the other hand, when the VSRAM is in the standby state or the power-down state the address signals $A'_0$~$A'_{19}$ for externally accessing the VSRAM are not sent from the CPU to the VSRAM.

However, when the VSRAM is in the standby state, but the flash memory is in the operation state, address signals $A'_0$~$A'_{19}$ for externally accessing the flash memory are sent from the CPU to the flash memory. The VSRAM and the flash memory use a common bus line. As a result, the address signals $A'_0$~$A'_{19}$ for externally accessing the flash memory are also input in the VSRAM. Accordingly, even when the VSRAM (semiconductor device 1) is in the standby state an ATD) signal is generated, and therefore a refreshing operation can be performed based on the ATD signal.

External accesses to the semiconductor device 1 (for example, reading and writing data) can be performed in the same manner as performed in an ordinary SRAM (static random access memory), and the description thereof is omitted. Refresh operations of the semiconductor device 1 are described, individually in the operation state, the standby state and the power-down state.

Figure 3:
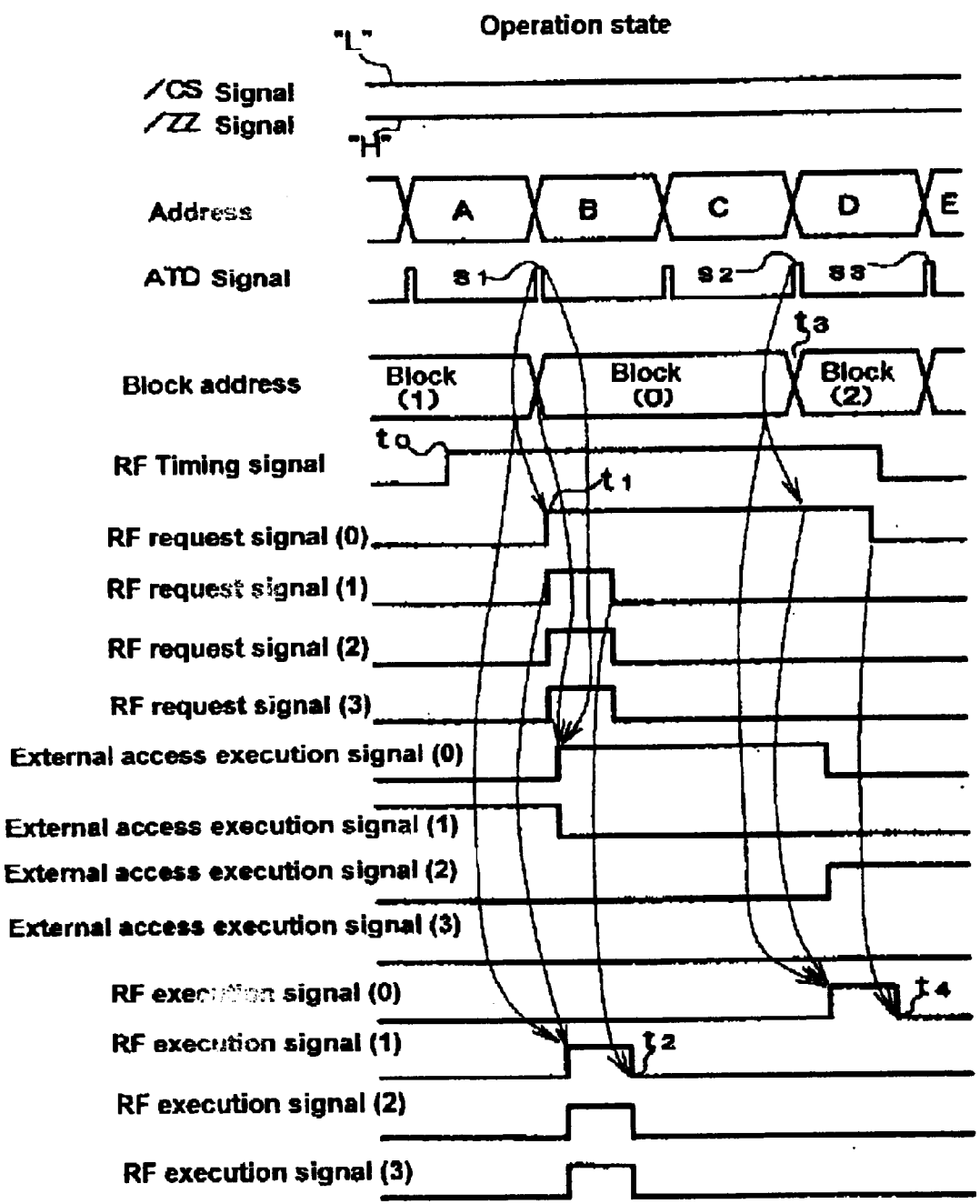
FIG. 3 shows a timing chart to describe an operation state of the semiconductor device in accordance with one embodiment of the present invention.

A refresh operation when the semiconductor device 1 is in the operation state is described with reference FIG. 1 and FIG. 3. FIG. 3 is a timing chart to describe the operation state of the semiconductor device 1. Since the chip select signal /CS is at L level, and the snooze signal /ZZ is at H level, the operation state takes place.

Addresses are addresses of memory cells that are externally accessed The addresses are defined by the block address signals $A_0$ and $A_1$, the column address signals $A_2$–$A_7$, and the row address signals $A_8$–$A_{19}$. Each time the address is chanced, the ATD signal generation circuit 150 generates an ATD signal in a pulse-shape.

Block addresses are addresses of the blocks 22 to be selected (in other words, the blocks 22 to which memory cells to be externally accessed belong). For example, an address A is present in the block (1) 22B, addresses B and C are present in the block (0) 22A, and an address D is present in the block (2) 22C.

At time $t_0$, the RF timing signal becomes H level (active). When the RF timing signal is at H level, the RF request signals (0)–(3) become H level (active) based on a first ATD signal ($s_1$) (at time $t_1$). This operation is described in greater detail below.

At time $t_1$, the block (0) is selected. Based on the ATD signal ($s_1$) and the selection of the block (0), the block (0) control 40A outputs an external access execution signal (0) at H level (active). On the other hand, the remaining block controls 40 output RF execution signals (1)–(3) based on the ATD signal ($s_1$) and the RF request signals (1)–(3). The operations are described in greater detail below.

After time $t_1$, a memory cell to be externally accessed (which is located in block (0)) is externally accessed by the external access execution signal (0). In other words, an external access (for example, wiring or reading) operation is conducted for a memory cell that is selected by the row decoder 24A and the column decoder 26A. On the other hand, in the remaining blocks, a refresh operation is conducted for memory cells to be refreshed (for example, those in an n-th row) by the RF execution signals (1)–(3). The operations are described in greater detail below.

After a period of time required for refreshing has passed, the RF request signals (1)–(3) become L level (non-active). As a result, the RF execution signals (1)–(3) become L level (non-active), whereby the refreshing is completed (at time $t_2$). The operation is described in greater detail below.

While the block address is selecting the block (0), refreshing of memory cells in the n-th row to be refreshed in the block (0) 22A is postponed. When the block address is changed from the block (0) to another block, refreshing of the memory cells in the n-th row to be refreshed in the block (0) is performed. This operations is described in greater detail. At time $t_3$ (when an ATD signal ($S_2$) is generated), the block address is changed from the block (0) 22A to the block (2) 22C. Since the RF request signal (0) is at H level (active), the block (0) control 40A outputs a RF execution signal (0) at H level based on the ATD signal ($S_2$) at H level and he RF request signal (0) at H level. As a result, in the block (0) 22A, memory cells in the same row (the n-th row) that is refreshed in each of the other blocks 22 during the selection period of the block (0) are refreshed. After a period of time required for refreshing has passed, the RF request signal (0) becomes L level. As a result, the RF execution signal (0) becomes L level, whereby the refreshing is completed (at time $t_4$). Then, the RF timing signal generation circuit 70 is reset by the RF request signals (0)–(3) at L level, whereby the RF timing signal becomes L level (non-active).

By the steps described above, refreshing for the memory cells that are selected by the word lines in the n-th row in the blocks (0)–(3) in the operation state is completed.

It is noted that the word line in the n-th row in each of the blocks 22 has the following two meanings. In the present embodiment, either of them is acceptable. The first one mans word lines that are located in the geometrically same positions in each of the blocks 22. The second one means word lines that are located in the same row in address space in each of the blocks 22. In other words, word lines located in the same row as viewed from the block control 40. In the second meaning, word lines in the n-th row in each of the blocks 22 are not necessarily located at the same geometrically same positions.

Figure 4:
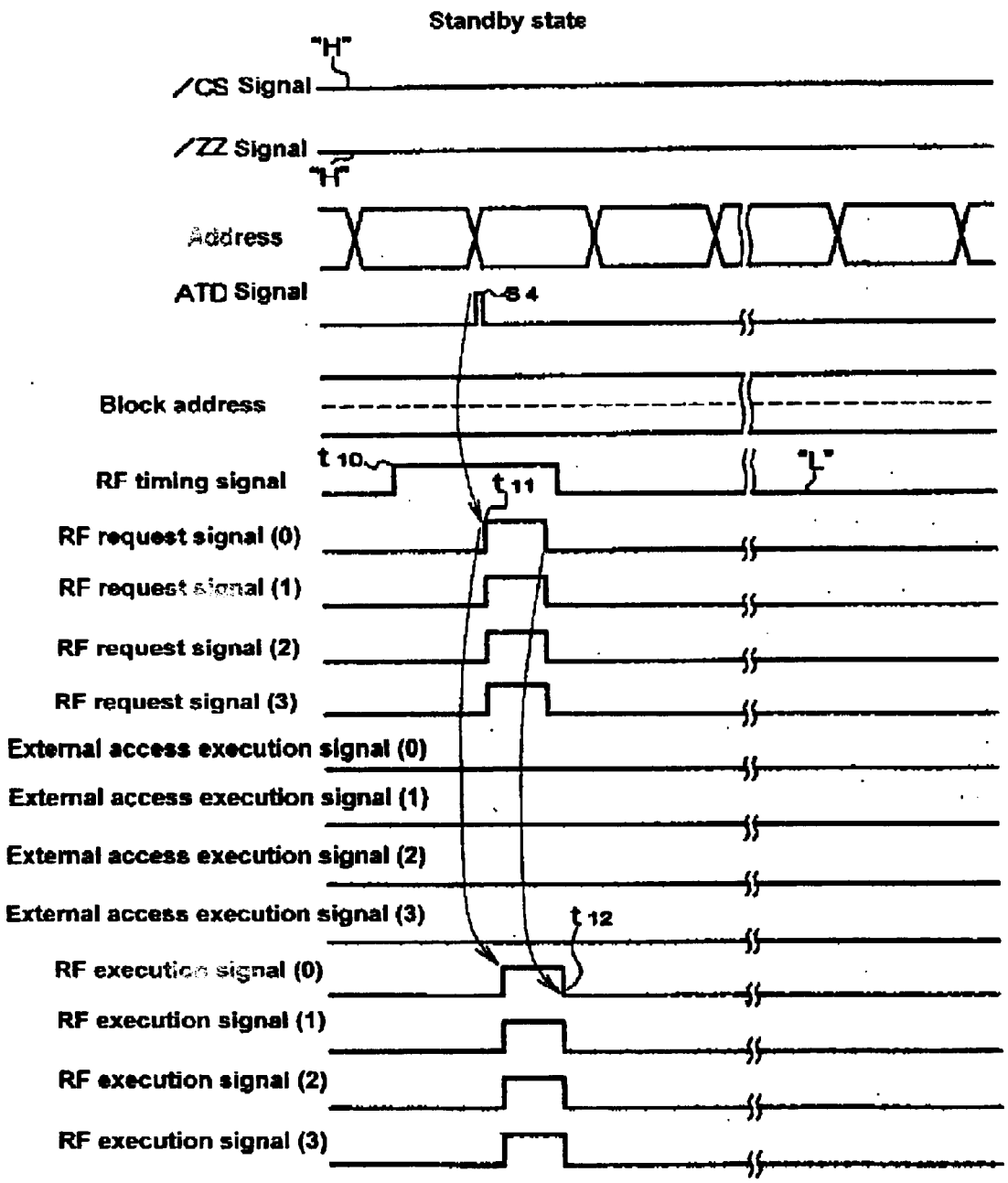
FIG. 4 shows a timing chart to describe a standby state of the semiconductor device in accordance with one embodiment of the present invention.

Next, a refresh operation while the semiconductor device 1 is in the standby state is described using FIG. 1 and FIG. 4. FIG. 4 shows a timing chart to described a standby state of the semiconductor device 1. Since the chip select signal /CS is at H level, and the snooze signal /ZZ is at H level, the standby state takes place.

As shown in FIG. 2, the semiconductor device 1 (VSRAM) and the flash memory commonly use the bus line for the address signals $A'_0$~$A'_{19}$. Therefore, even when the semiconductor device 1 is in the standby state, address signals to the flash memory are input in the semiconductor device 1 through the address buffer 60 if the flash memory is in the operation state. Therefore, as shown in FIG. 4, addresses are selected Accordingly, even when the semiconductor device 1 is in the standby state, an ATD signal is generated, such that memory cells in a row to be refreshed in each of the blocks 22 can be refreshed based on the ATD signal.

However, when the semiconductor device 1 is in the standby state, the write enable (WE) and the output enable (OE) are not possible, and therefore an external access to the memory cells in the semiconductor device 1 is prohibited. The operation is described below.

At time $t_{10}$, the RF timing signal becomes H level. When the RF timing signal is at H level, the RF request signals (0)–(3) become H level based on a first ATD signal ($s_4$) (at time $t_{11}$). This operation is described in greater detail below.

In the standby state, none of the blocks (0)–(3) are selected, and therefore the block controls 40 output RF execution signals (0)–(3) at H level. The reason why this can be done, even through the address signals to the flash memory are input in the semiconductor device 1 through the address buffer 60, is described in greater detail below.

After time $t_{11}$, memory cells to be refreshed in all of he blocks 20 are refreshed. After a period of time required for refreshing has passed, the RF request signals (0)–(3) become L level. As a result, the RF execution signals (0)–(3) become L level (non-active), whereby the refreshing is completed (at time $t_{12}$). Then, the RF timing signal becomes L level. These operations are the same as those described above at time $t_1$~$t_2$, and therefore their description is omitted.

By the steps described above, during the standby state, refreshing of the memory cells that are connected to the word line in a row to be rushed (for example, the n-th row) in the blocks (0)~(3) is completed.

It is noted that, in the present embodiment, an ATD signal is not generated in the standby state when the RF timing signal is at L level. By this, a lower power consumption can be achieved. This operation is described in greater detail below. It is noted that, in the present embodiment, when the RF timing signal is at L level, an ATD signal is not generated, and therefore refreshing is not performed. However, even when the RF timing signal is at L level, an ATD signal may be generated and refreshing may be performed.

Figure 5:
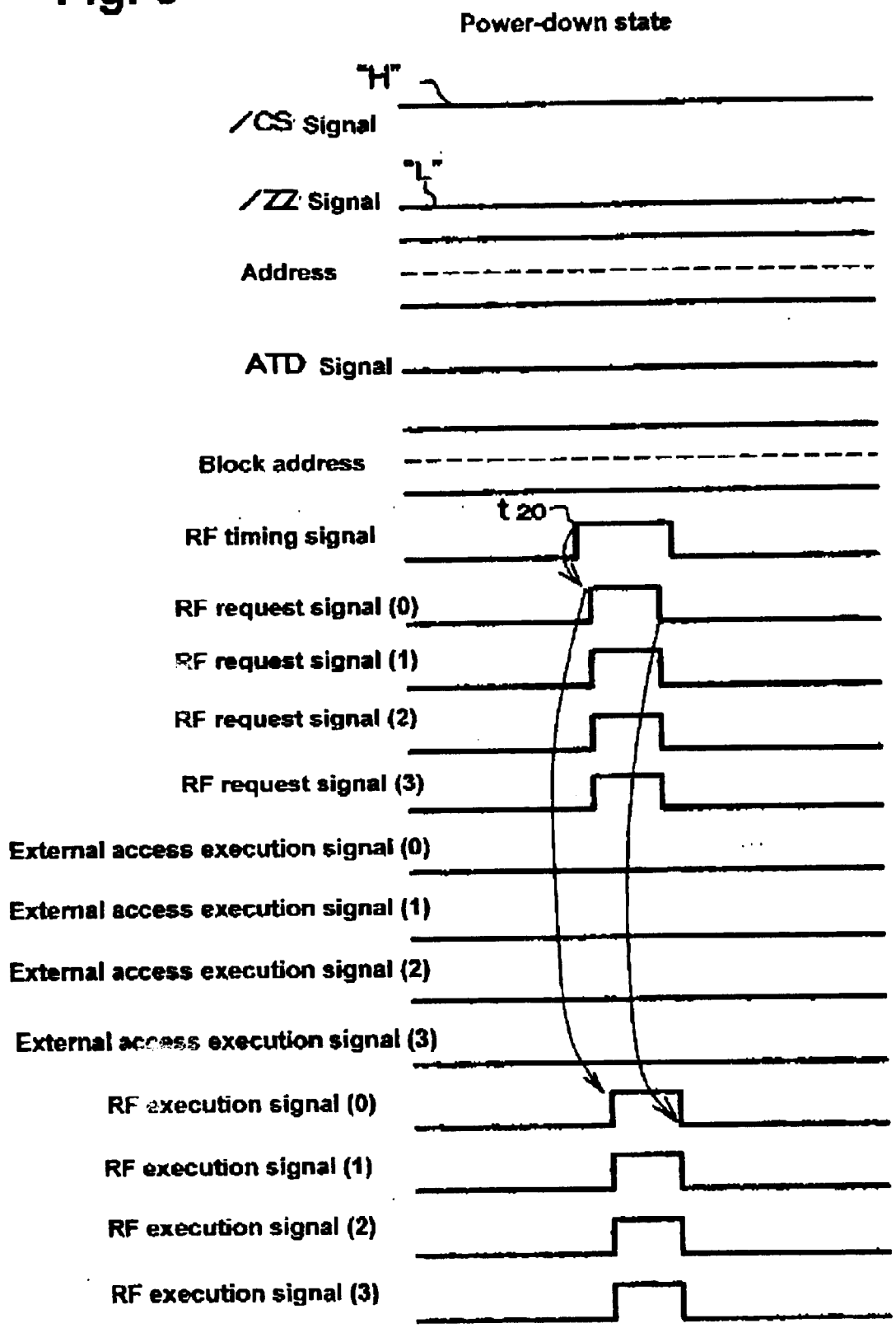
FIG. 5 shows a timing chart to describe a power-down state of the semiconductor device in accordance with one embodiment of the present invention.

Next, a refresh operation when the semiconductor device 1 is in the power-down state is described, using FIG. 1 and FIG. 5. FIG. 5 shows a timing chart to described a power-down state of the semiconductor device 1. Since the chip select signal /CS is at H level and the snooze signal /ZZ is at L level, the power-down state takes place.

During the power-down state, address signals are not externally input in the semiconductor device 1, and therefore an ATD signal is not generated. Accordingly, a refresh operation is conducted based on rising of the RF timing signal. More specifically, at time $t_{20}$, the RF timing signal rise to H level (active). By this, the RF request signals (0)~(3) become H level (active). The operation is described below. Succeeding operations are the same as those described which take place after time $t_{11}$.

The above describes a refresh operation of the semiconductor device 1. In accordance with present embodiment, in a refreshing capable period, for example, a period between a start of rising of a certain refresh request signal and rising of a next refresh request signal, and a refreshing operation is performed in the refresh capable period (see FIG. 15.), refreshing is performed for memory cells that are selected by the word line in the n-th row in each of the blocks 22, and in the next refreshing capable period, refreshing is performed for memory cells that are selected by the word line in the (n+1)th row in each of the blocks 22. Then, when refreshing is performed for memory cells that are selected by the word line in the last row (ie, in the present embodiment, the $4095^{th}$ row), refreshing is performed for memory cells that are selected by the word line in the fist row (ie, the $0^{th}$ row). A series of the above operations is repeated. The n-th row may or may not be located in the geometrically same positions in each of the blocks 21.

Main effects of the present embodiment are described As shown in FIG. 3 in accordance with the present embodiment, in the operation state, while one of the blocks 22 (for example, the block (0) 22A) is externally accessed, memory cells in rows to be refreshed in all of the remaining blocks 22 other than the externally accessed block 22 (for example, the block (1) 22B, the block (2) 22C and the block (3) 22I) are refreshed. Accordingly, the semiconductor device 1 can be effectively operated.

Also, in accordance with the present embodiment, memory cells in rows to be refreshed in the blocks 22 are refreshed based on ATD signals or RF timing signals. Accordingly, clocks for timing the refreshing operations are made unnecessary. In particular, if refreshing operations are timed by using eternal clocks, an external clock terminal needs to be additionally required in the semiconductor device 1. This is not required in the present embodiment. Accordingly, an input/output interface of the semiconductor device 1, for example the address buffer 60, the data I/O buffer 10, and the CS control 110 may be formed in a similar manner as that of an SRAM (static random access memory). Therefore, the semiconductor device 1 can be regarded as an SRAM for use.

Also, in accordance with the present embodiment, when a refreshing is performed based on ATD signals for a block, for example the block (0) shown in FIG. 3, in which refreshing is started in a period between one ATD signal and the next ATD signal, for example during the period between generation of the ATD signal $s_2$ and generation of the ATD signal $s_3$, shown in FIG. 3, refreshing of memory cells in rows to be refreshed is completed during the period. Therefore, when a selection period for addresses of memory cells to be externally accessed, for example the selection period for D shown in FIG. 3, is completed, and the next selection period for addresses of memory cells to be externally accessed, for example the selection period for E shown in FIG. 3, starts, a refreshing is not performed for the memory cells to be externally accessed next, and therefore the external access is not delayed.

To achieve this effect, the cycle for the externally provided address signals $A'_0$~$A'_{19}$ (for example, 50 ns~100 ns) may be made longer than the period in which a refresh execution signal is at H level (for example, 20 ns~40 ns). In other words, the period between the start of refreshing and its completion is generally the same as the period in which a refresh execution signal is at H level. On the other hand, externally provided address signals are input in the semiconductor device 1 in a specified cycle. When address signals do not change (in other words, when an address signal in one cycle is the same as an address signal in the next cycle), addresses do not change, and an ATD signal is not generated In this manner, since ATD signals depend on the cycle of externally provided address signals, the cycle for externally provided address signals may be made longer than the period in which the refresh execution signal is generated.

Also, in accordance with the present embodiment, the block (0) 22A—the block (3) 22D are selected by the block address signals $A_0$ and $A_1$. In other words, lower addresses among the externally provided address signals $A'_0$~$A'_{19}$ are allocated to block addresses. The lower the address signals, the more often they change, and therefore they would likely change constantly for those of the blocks 22 that are externally accessed. Therefore, allocating the block address signals in the manner described above can prevent a refreshing in a certain block 22 from being continuously delayed. Therefore, the certainly of refreshing in all of the blocks 22 can be increased.

Figure 6:
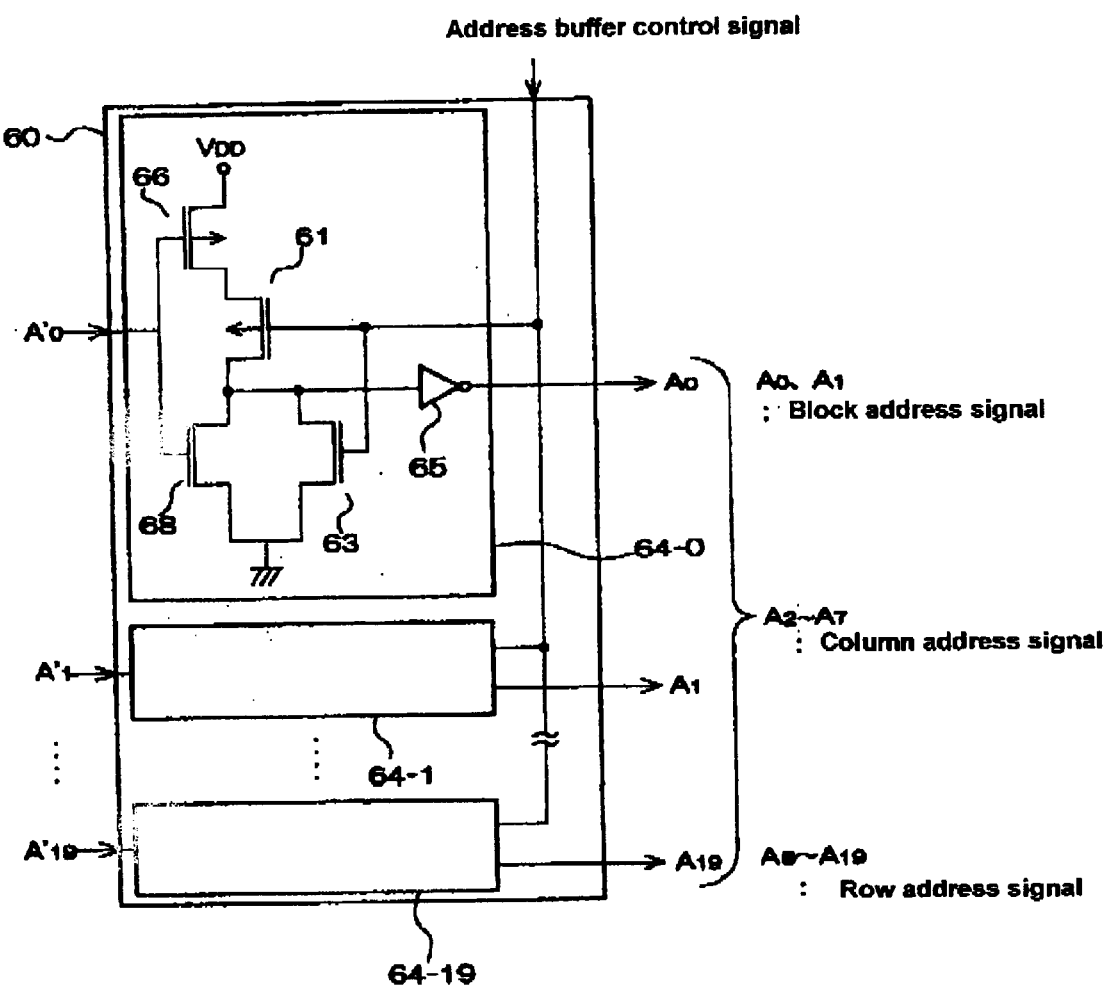
FIG. 6 shows an exemplary circuit block diagram of an address buffer that is provided in the semiconductor device in accordance with one embodiment of the present invention.
Figure 7:
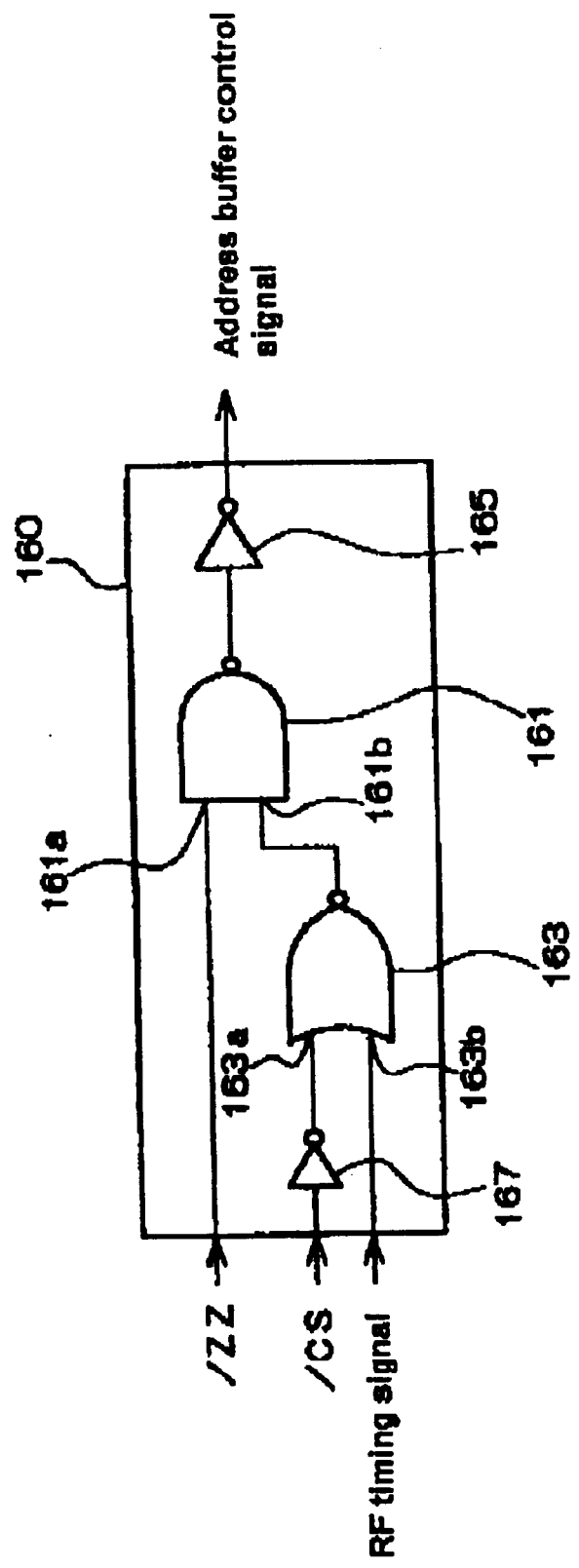
FIG. 7 shows an exemplary circuit block diagram of an address buffer control circuit that is provided in the semiconductor device in accordance with one embodiment of the present invention.

Next, the address buffer 60 and the address buffer control circuit 160 are described. FIG. 6 shows an exemplary circuit block diagram of the address buffer 60. FIG. 7 shows an exemplary circuit block diagram of the address buffer control circuit 160.

As shown in FIG. 6, the address buffer 60 is equipped with input control sections in the number corresponding to the address signals $A'_0$~$A'_{19}$, namely, twenty input control sections 64-0–64-19. The input control sections 64-0–64-19 receive inputs of the eternally provided address signals $A'_0$~$A'_{19}$, respectively, and output corresponding signals $A_0$~$A_{19}$ (block address signals, column address signals and row address signals), respectively. Also, an address buffer control signal from the address buffer control circuit 160 (FIG. 7) is input in the address buffer 60.

Operations of the address buffer 60 and the address buffer control circuit 160 are described, individually for the operation state of the semiconductor device 1, the standby state (with RF timing signal being at H level), the standby state (with RF timing signal being at L level) and the power-down state.

In the operation state, the chip select signal /CS is at L level, and the snooze signal /ZZ is at H level. As shown in FIG. 7, the chip select signal /CS is at L level is input in the address buffer control circuit 160. The signal at L level is inverted by an inverter 167 to become a signal at H level, and input in an input terminal 163b of a NOR gate 163. By this, a signal at L level output from the NOR gate 163 is input in an input terminal 161b of a NAND gate 161. By this, the NAND gate 161 outputs a signal at H level, and the signal at H level is inverted by an inverter 165 to become a signal at L level. The signal at L level becomes an address buffer control signal.

As shown in FIG. 6, the address buffer control signal at L level is input in the address buffer 60, and then inputted in each of the input control sections 64-0~64-19. Operations of the input control sections 64-0–64-19 in this instance are described, by using the input control section 64-0–64-19 as an example. The address buffer control signal at L level is applied to gates of a pMOS 61 and a nMOS 63 in the input control section 64-0. The pMOS 61 turns ON, and the nMOS 63 turns OFF.

On the other hand, the externally provided address signal $A'_0$ is input in a CMOS inverted disposed in the input control section 64-0 and formed from a pMOS 66 and an nMOS 68. As described above, the pMOS 61 is ON, and the nMOS 63 is OFF. Therefore, the address signal $A'_0$ is inverted by the CMOS inverter further inverted by an inverter 65, and output from the address buffer 60 as a block address signal $A_0$. In other words, the externally provided address signal $A'_0$ is input in the semiconductor device 1 and allocated as de block address signal $A_0$. The input control sections 64-1~64-19 also have the same structure and operate in the same manner.

In the standby state, the chip select signal/CS is at H level, and the snooze sign /ZZ is at H level. As shown in FIG. 7, the RF timing signal at H level is input in the address buffer control circuit 160. The signal at H level is input in the input teal 163b of the NOR gate 163. By this, a signal at L level is output from the NOR gate 163. Thereafter, in a similar manner as that described above, the address signal $A'_0$ is input in the semiconductor device 1, and allocated as a block address signal $A_0$. However, since the address signals $A'_0$~$A'_{19}$ are address signals to the flash memory shown in FIG. 2, the memory cells of the memory cell array 20 of the semiconductor device 1 are not externally accessed. In the present embodiment, when the semiconductor device 1 is in the standby state, ATD signals are generated by the address signals to the flash memory, and a refreshing is conduced based on the ATD signals. Memories that can be used in this manner other than a flash memory includes, for example, a SRAM, and another VSRAM.

As shown in FIG. 7, the chip select signal /CS at H level is input in the address buffer control circuit 160. The signal at H level is inverted by the inverter 167 to become H level, and input in an input terminal 163a of the NOR gate 163. Also, the RF timing signal at L level is input in the address buffer control circuit 160, and input in the input terminal 163b of the NOR gate 163.

As a result, the si at H level that is output from the NOR gate 163 in input in the input terminal 161b of the NAND gate 161. The snooze signal /ZZ at H level is input in an input terminal 161a of the NAND gate 161, such that a signal at level is output from the NAND gate 161. The signal at L level is inverted by the inverter 165 to become a signal at H level. The signal at H level becomes an address buffer control signal.

As shown in FIG. 6, the address buffer control signal at H level is applied to the gates of the pMOS 61 and the nMOS 63. The pMOS 61 turns OFF, and the nMOS 63 turns ON. As a result, a signal at L level is always output from the CMOS inverter (pMOS 66 and nMOS 68) when the externally provided address signal $A'_0$ is either at L level or H level. In other words, the externally provided address signals A' are prohibited from entering the semiconductor device 1. Accordingly, when the RF timing signal is at L level, ATD signals are not generated, whereby a lower power consumption of the semiconductor device 1 can be achieved. It is noted that, as described above, when the RF timing signal is at H level, ATD signals are generated. Therefore, during the standby state, the period in which the RF timing signal is at H level corresponds to a period in which ATD signals can be generated.

In the power-down state, external address signals do not exist in the present embodiment. Therefore, no external address signal is input in the address buffer 80. It is noted that, in the power-down state, and when external address signals are present, the address buffer control circuit 160 may be used to control such that ATD signals are not generated even when addresses change.

Figure 8:
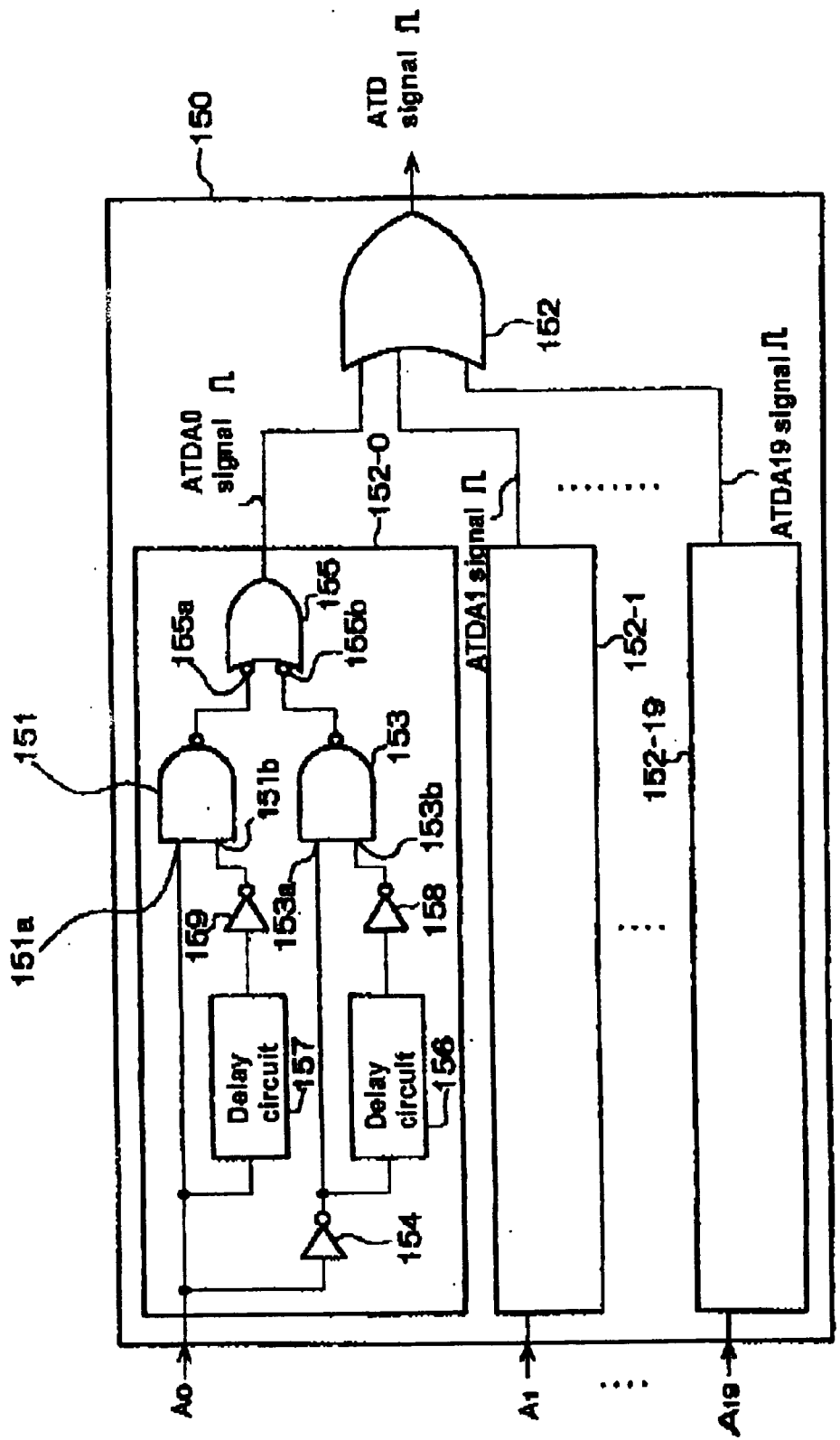
FIG. 8 shows an exemplary circuit block diagram of an ATD signal generation circuit that is provided in the semiconductor device in accordance with one embodiment of the present invention.

Next, the ATD signal generation circuit 150 is described. FIG. 8 shows an exemplary circuit block diagram of the ATD signal generation circuit 150. As shown in FIG. 8, the ATD signal generation circuit 150 is equipped with signal change detection sections in the number corresponding to the NOR gates 152 and the signals (block address signals, column address signals and row address s signals) $A_0$~$A_{19}$, namely, twenty signal change detection sections 152-0~152-19. The signals $A_0$~$A_{19}$ are input in the corresponding signal change detection sections 152-0~152-19 through the address buffer 60 (FIG. 1), respectively. When at least one of the signals $A_0$~$A_{19}$ changes its L level to H level, or vice verse (in other words, when addresses are changed), the ATD signal generation circuit 150 outputs an ATD signal in a pulse-shape.

Circuit structures of the signal change detection sections 152-0~152-19 are described by using the signal change detection section 152-0) as an example. When the signal $A_0$ that is input in the signal change detection section 152-0 changes from H level to L level, or from L level to H level, the signal change detection section 152-0) outputs an ATD$A_0$ signal in a pulse-shape. Assume that, for example the signal $A_0$ is at H level as its initial state, and the signal $A_0$ changes from H level to L level.

The signal $A_0$ at H level is input in the signal change detection section 152-0. The signal $A_0$ at H level is input in an input terminal 151a of a NAND gate 151. Also, the signal $A_0$ at H level passes a delay circuit 157, inverted by an inverter 159 to become a signal at L level, and input in an input the 151b of the NAND gate 151. As a result, a signal at H level is output from the NAND gate 151 and input in an input terminal 155a of a NAND gate 155.

On the other hand, the above-described signal $A_0$ at H level is inverted by an inverter 154 to become a signal at L level, and input in an input terminal 153a of a NAND gate 153. Also, the above-described signal $A_0$ at H level is inverted by the inverter 154 become a signal at L level, which passes a delay circuit 156, is inverted by an inverter 158 to become a signal at H level, and input in an input terminal 153b of the NAN gate 153. As a result, a signal at H level is output from the NAND gate 153, and input in an input terminal 155b of the NAND gate 155.

As a result, a signal output from the NAND ate 155 becomes L level, and therefore an ATD$A_0$ signal is not generated.

In the above-described state, assume that the signal $A_0$ changes, for example, from H level to L level. By the signal $A_0$ at L level, a signal input in the input terminal 151a changes from H level to L level. Accordingly, the signal output from the NAND gate 151 remains at H level.

On the other hand, by the signal $A_0$ at L level, a signal that is input in the input terminal 153a changes from L level to H level. Since the input terminal 153b connects to the delay circuit 156, the signal that is input in the input terminal 153b still remains at H level. As a result, the signal output from the NAND gate 153 changes from H level to L level. Therefore, an ATDA$_0$ signal (at H level) is output from the NAND gate 155.

The signal that is input in the input terminal 153b changes from H level to L level after a specified period of time has passed. This is because the signal A$_0$ at L level is inverted by the inverter 154, passed through the delay circuit 156, inverted by the inverter 158 and input in the input terminal 153b. Because the signal that is input in the input terminal 153b changes from H level to L level, the signal that is output from the NAND gate 153 changes from L level to H level. Accordingly, after a specified period of time has passed, an output of the ATDA$_0$ signal (at H level) stops.

Circuit structures of the signal change detection sections 152-1~152-19 are the same as the circuit structure of the signal change detection section 152-0. When the respective input signals A$_1$~A$_{19}$ change from H level to L level, or from L level to H level, the signal change detection sections 152-1~152-19 output ATDA$_1$~ATDA$_{19}$ signals in a pulse-shape, respectively.

When at least one of the ATDA$_0$~ATDA$_{19}$ signals in a pulse-shape is generated, the NOR gate 152 outputs a signal in a pulse-shape. This signal becomes an ATD signal in a pulse-shape that is output from the ATD signal generation circuit 150.

Figure 9:
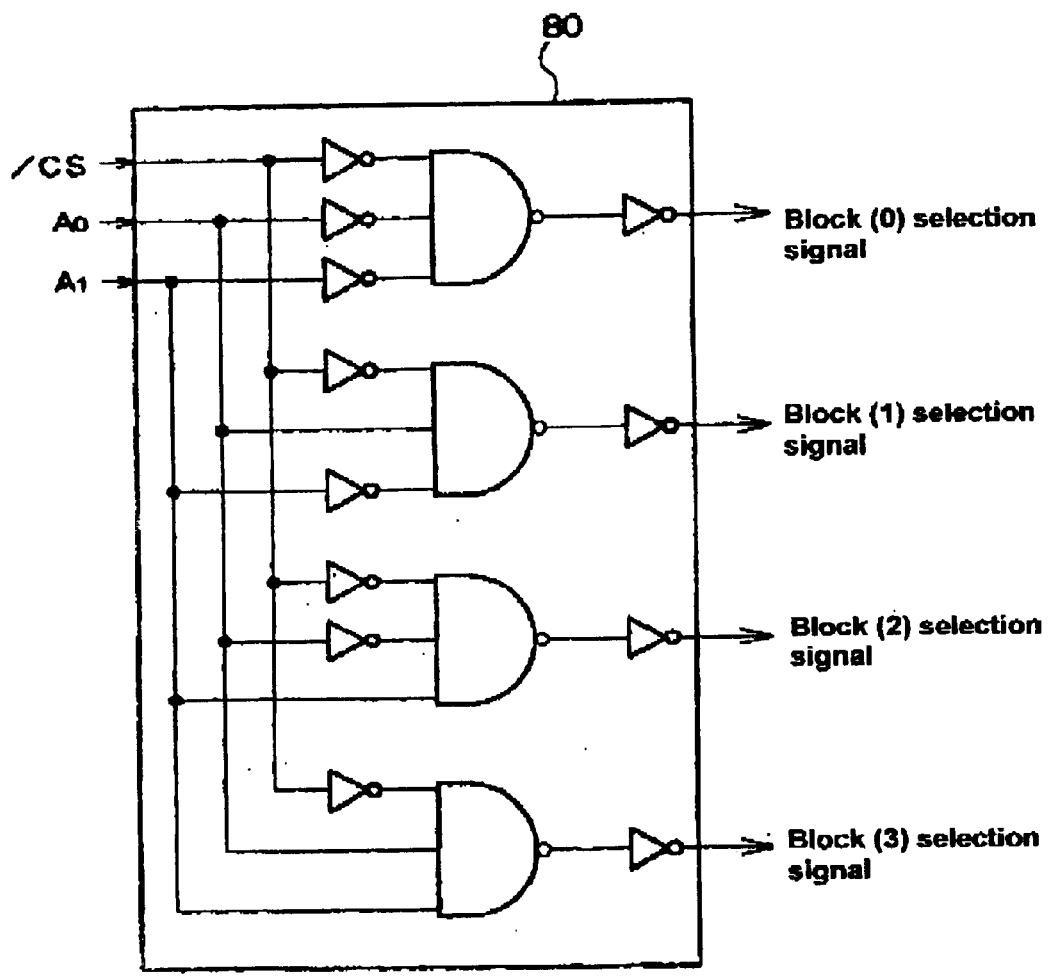
FIG. 9 shows an exemplary circuit block diagram of a block selection signal generation circuit that is provided in the semiconductor device in accordance with one embodiment of the present invention.

Next the block selection signal generation circuit 80 is described in detail with reference to FIG. 9. FIG. 9 shows an exemplary circuit block diagram of the block selection signal generation circuit 80. The chip select signal /CS and the block address signals A$_0$ and A$_1$ are input in the block selection signal generation circuit 80. The block selection signal generation circuit 80 outputs block (0) selection signal~block (3) selection signal. The block selection signal generation circuit 80 is structured to have a logical circuit such that achieves the following (A)–(E).

(A) When the chip select signal /CS is at L level, and the block address signals (A$_0$ and A$_1$) are at (L level and L level), the block selection signal generation circuit 80 outputs a block (0) selection signal at H level (active), as well as a block (1) selection signal, a block (2) selection signal and a block (3) selection signal at L level (non-active).

(B) When the chip select signal /CS is at L level, and the block address signals (A$_0$ and A$_1$) are at (H level and L level), the block selection signal generation circuit 80 outputs a block (1) selection signal at H level (active), as well as a block (0) selection signal, a block (2) selection signal and a block (3) selection signal at L level (non-active).

(C) When the chip select signal /CS is at L level, and the block address signals (A$_0$ and A$_1$) are at (L level and H level), the block selection signal generation circuit 80 outputs a block (2) selection signal at H level (active), as well as a block (0) selection signal, a block (1) selection signal and a block (3) section signal at L level (non-active).

(D)) When the chip select signal /CS is at L level, and the block address signals (A$_0$ and A$_1$) are at (H level and H level), the block selection signal generation circuit 80 outputs a block (3) selection signal at H level (active), as well as a block (0) selection signal, a block (1) selection signal and a block (2) selection signal at L level (non-active).

(E) When the chip select signal /CS is at H level, the block selection signal generation circuit 80 outputs a block (0) selection signal a block (1) selection signal, a block (2) selection signal and a block (3) selection signal at L level (non-active).

It is noted that, during the standby state, address signals to the flash memory are input in the semiconductor device 1 through the address buffer 60 in order to generate ATD signals. During the standby state, the chip select signal /CS is at H level. Accordingly, none of the blocks (0)~(3) is selected, and therefore the block selection signal generation circuit 80 outputs block (0) selection signal~block (3) selection signal at L level (non-active). As a result, that block controls 40 output RF execution signals (0)~(3) at H level (active), whereby memory cells in rows to be refreshed are refreshed in all of the blocks 22.

Figure 10:
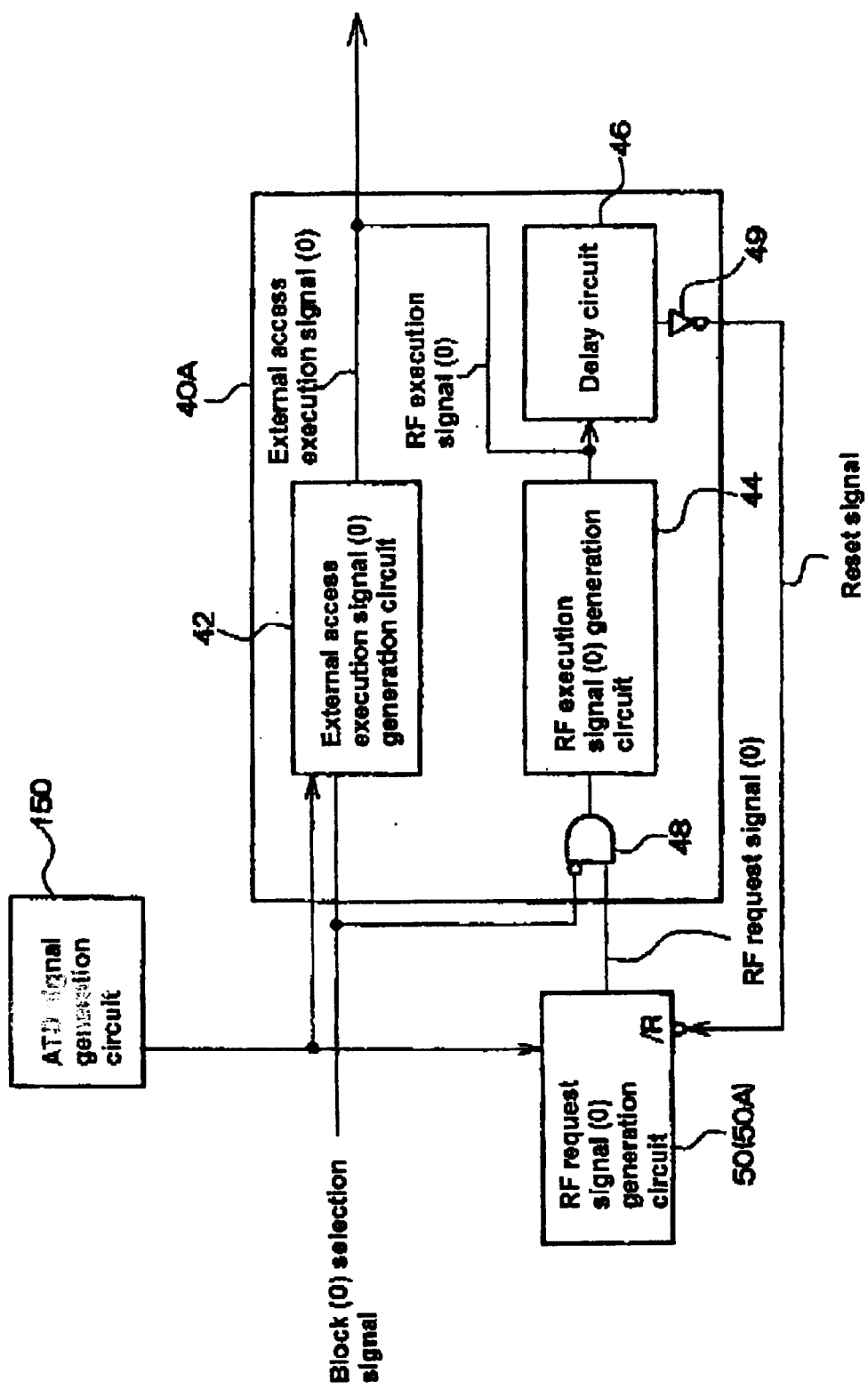
FIG. 10 shows an exemplary circuit block diagram of a block control that is provided in the semiconductor device in accordance with one embodiment of the present invention and its relating circuits.

Next, the block controls 40 are described in detail by refreshing to the block (0) control 40A as an example. FIG. 10 shows an exemplary circuit block diagram of the block (0) control 40A and its relating circuits. The block (0) control 40A can be equipped with an external access execution signal (0) generation circuit 42, a RF execution signal (0) generation circuit 44, a delay circuit 46, an AND gate 48 and an inverter 49.

An operation that takes place when the block (0) 22A is selected (externally accessed) is described. In this case, a block (0) selection signal at H level (active), and a RF request signal (0) at H level (active) are input in the block (0) control 40A.

As a result, the block (0) selection signal at H level and the RF request signal (0) at H level are input in the AND gate 48. As a result, the AND gate 48 outputs a signal at L level, and the signal at L level is input in the RF execution signal (0) generation circuit 44.

In the meantime, the block (0) selection signal at H level is input in the external access execution signal (0) generation circuit 42.

An ATD signal from the ATD signal generation circuit 150 is input in the external access execution signal (0) generation circuit 42 and RF request signal (0) generation circuit 50. Since the block (0) selection signal at H level is input in the external access execution signal (0) generation circuit 42, the external access execution signal (0) generation circuit 42 outputs, based on the ATD signal, an external access execution signal (0) at H level (active). It is noted that since the signal at L level from the AND gate 48 is input in the RF execution signal (0) generation circuit 44, the RF execution signal (0) generation circuit 44 outputs a RF execution signal (0) at L level (non-active). The external access execution signal (0) at H level becomes an output signal of the block (0) control 40A.

Next, an operation that takes place when the block (0) 22A is not selected (not externally accessed) is described. A block (0) selection signal at L level (non-active), and a RF request signal (0) at H level (active) are input in the block (0) control 40A.

As a result, the block (0) selection signal at L level and the RF request signal (0) at H level are input in the AND gate 48. As a result, the AND gate 48 outputs a signal at H level, and the signal at H level is input in the RF execution signal (0) generation circuit 44.

In the meantime, the block (0) selection signal at L level is input in the external access execution signal (0) generation circuit 42.

An ATD signal from the ATD signal generation circuit 150 is input in the external access execution signal (0) generation circuit 42 and RF request signal (0) generation circuit 50. Since the signal at H level from the AND gate 48 is input in the RF execution signal (0) generation circuit 44, the RF execution signal (0) generation circuit 44 outputs, based on the ATD signal, a RF execution signal (0) at H level (active). It is noted that since the block (0) selection signal at L level is input in the external access execution signal (0) generation circuit 42, the external access execution signal (0) generation circuit 42 outputs an external access execution signal (0) at L level (non-active). The RF execution signal (0) at H level (active) becomes an output of the block (0) control 40A.

It is noted that the RF execution signal (0) is also input in the delay circuit 46. Accordingly, the RF execution signal (0) at H level is also input in the delay circuit 46. The delay circuit 46 outputs a reset signal at H level after a time required for refreshing has passed (for example, 20 ns–40 ns). The reset signal is inverted by the inverter 49 to become a reset signal at L level, and input in a reset (/R) of the RF request signal (0) generation circuit 50A. As a result, the RF request signal (0) becomes L level (non-active). Consequently, the RF execution signal (0) becomes L level (non-active), whereby the refreshing is completed.

The other block controls 40B~40D have the same structure and perform the same operation as those of the block (0) control 40A. In accordance with the present embodiment, in the operation state, the generation of an external access execution signal (at H level) tom one of the block controls 40 is synchronized with the generation of RF execution signals (at H level) from all the other remaining block controls 40 based on the ATD signal.

Figure 11:
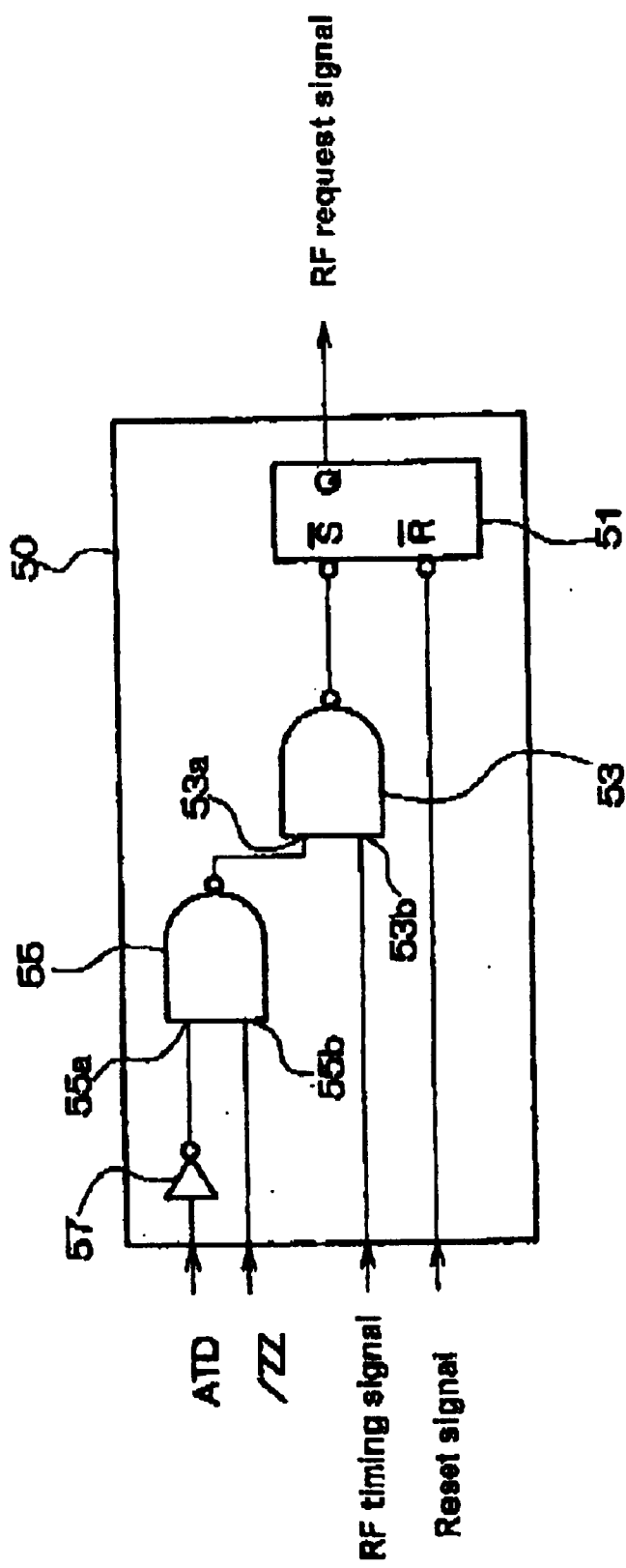
FIG. 11 shows an exemplary circuit block diagram of a RF request signal generation circuit that is provided in the semiconductor device in accordance with one embodiment of the present invention.

FIG. 11 shows an exemplary circuit block diagram of the RF request signal generation circuit 50. An ATD signal from the ATD signal generation circuit 150, a snooze signal /ZZ from the ZZ control 120, an RF timing signal from the RF timing signal generation circuit 70 and a reset signal from the block control 40 are input in the RF request signal generation circuit 50. Then, the RF request signal generation circuit 50 outputs a RF request signal. A concrete operation of the RF request signal generation circuit 50 is described.

In the operation state and the standby state of the semiconductor device 1, a snooze signal /ZZ at H level is input in an input terminal 55b of a NAND gate 55. As an ATD signal (at H level) is input in the RF request signal generation circuit 50 in a state in which a RF timing signal at H level is input in an input terminal 53b of the NAND gate 53, the ATD signal at H level) is inverted by an inverter 57 to become L level, and input in an input terminal 55a of the NAND gate 55. As a result, a signal at H level that is output from the NAND gate 55 is input in the input terminal 53a of the NAND gate 53.

Since signals at H level are input in the input this 53a and 53b, the NAND gate 53 outputs a signal at L level. The signal at L level is input in a /S input of a flip-flop 51. As a result, the flip-flop is set. In the manner described above, the RF request signals (0)~(3) become H level (active).

In the, power-down state of the semiconductor device 1, a snooze signal /ZZ at L level is input in the input terminal 55b of the NAND gate 55. As a result, the NAND gate 55 outputs a signal at H level. The signal at H level is input in the input terminal 53a of the NAND gate 53. In this state, when a RF timing signal at H level is input in the input terminal 53b of the NAND gate 53, the NAND gate 53 outputs a signal at L level The signal at L level is input in the /S input of the flip-flop 51. As a result, the flip-flop 51 is set, and the flip-flop 51 outputs a RF request signal at H level. In the manner described above, the RF request signals (0)~(3) become H level (active).

In the meantime, when a RF timing signal at L level is input in the input terminal 53b of the NAND gate 53, the NAND gate 53 outputs a signal at H level. Since the signal at H level is input in the /S input of the flip-flop 51, the flip-flop 51 is not set. Accordingly, when the RF timing signal is at L level, RF request signals (0)~(3) become L level (non-active).

Figure 12:
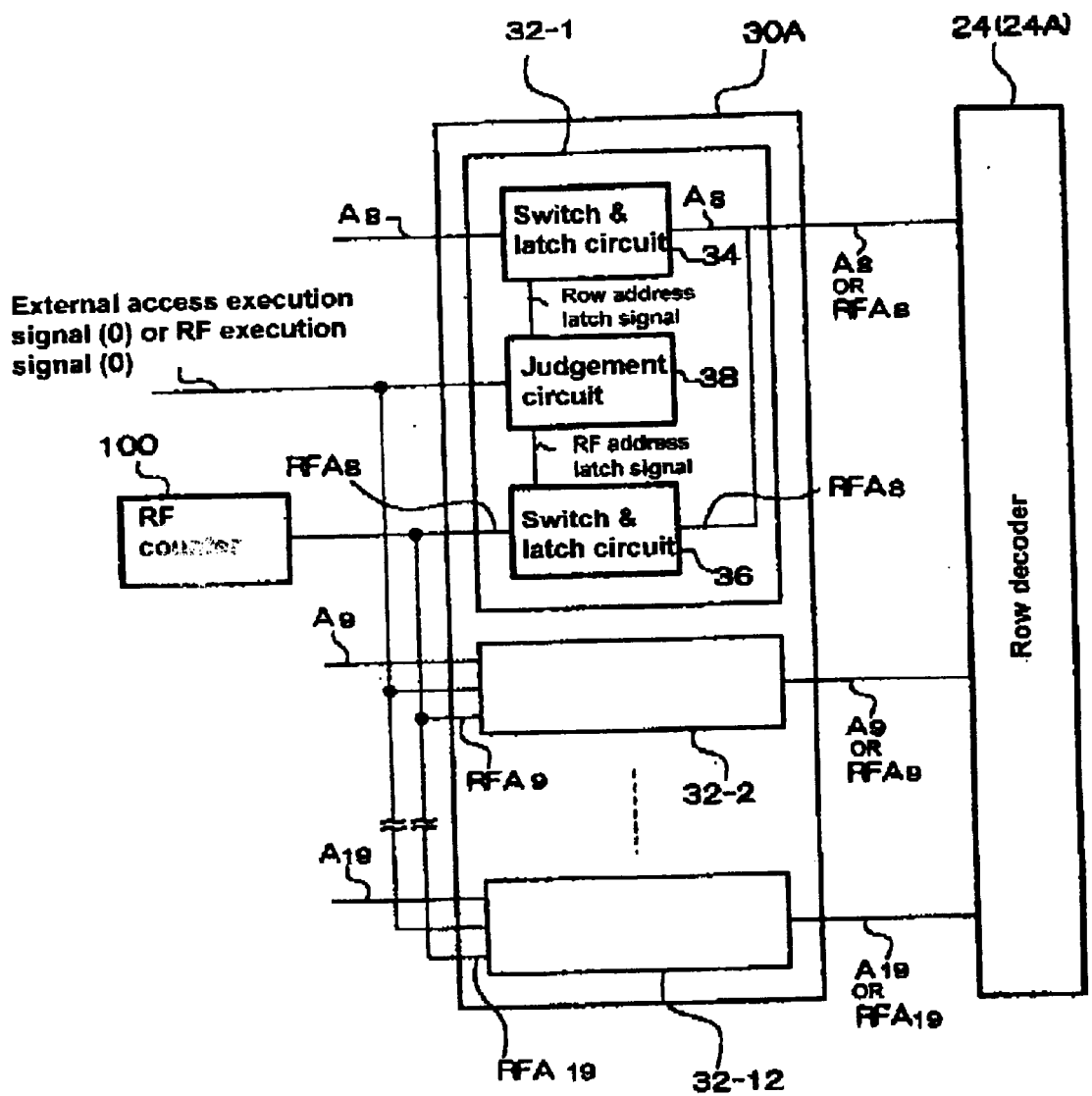
FIG. 12 shows an exemplary circuit block diagram of a row pre-decoder that is provided in the semiconductor device in accordance with one embodiment of the present invention and its relating circuits.

Next, the row pre-decoders 30A–30D are described in detail by referring to the row pre-decoder 30A as an example. FIG. 12 shows an exemplary circuit block diagram of the row pre-decoder 30A and circuits relating thereto. The row pre-decoder 30A can be equipped with selection sections in the number corresponding to the row address signals $A_8$~$A_{19}$, in other words, twelve selection sections 32-1~32-12. Each of the twelve selection sections 32-1~32-12 selects a row address signal or a refresh address signal.

Each of the selection sections 32-1~32-12 is equipped with a switch & latch circuits 34 and 36 and a judgment circuit 38. A row address signal (a row address signal $A_8$ in the case of the selection section 32-1) is input in the switch & latch circuit 34. A refresh address signal from the RF counter 100 (a refresh address signal $RFA_8$ in the case of the selection section 32-1) is input in the switch & latch circuit 36.

The judgment circuit 38 receives an input of a signal from the block (0) control 40A (FIG. 1), namely, either an external access execution signal (0) at H level or a RF execution signal (0) at H level. When the judgment circuit 38 judges that the external access execution signal (0) at H level is input in the judgment circuit 38, the judgement circuit 38 outputs a row address latch signal. The row address latch signal is input in the switch & latch circuit 34, and the switch & latch circuit 34 latches and outputs a row address signal. As a result, the row pre-decoder 30A outputs row address signals $A_8$~$A_{19}$. They are signals for driving word lines that select memory cells to be externally accessed. The driving signals are input in a row decoder 24A. Based on the driving signals, the row decoder 24A selects a word line to which memory cells to be externally accessed belong.

On the other hand, when the judgment circuit 38 judges the RF execution signal (0) at H level is input in the judgment circuit 38, the judgment circuit 38 outputs a RF address latch signal. The RF address latch signal is input in the switch & latch circuit 36, and the switch & latch circuit 36 latches and outputs a refresh address signal. As a result, the row pre-decoder 30A outputs refresh address signals $RFA_8$~$RFA_{19}$. They are signals for driving word lines that select memory cells in a row to be refreshed. The driving signals are input in the row decoder 24A. Based on the driving signals, the row decoder 24A selects a word line in a row to be refreshed.

The row pre-decoders 30B–30D can have the same structure and perform the same operation as those of the row pre-decoder 30A.

Figure 13:
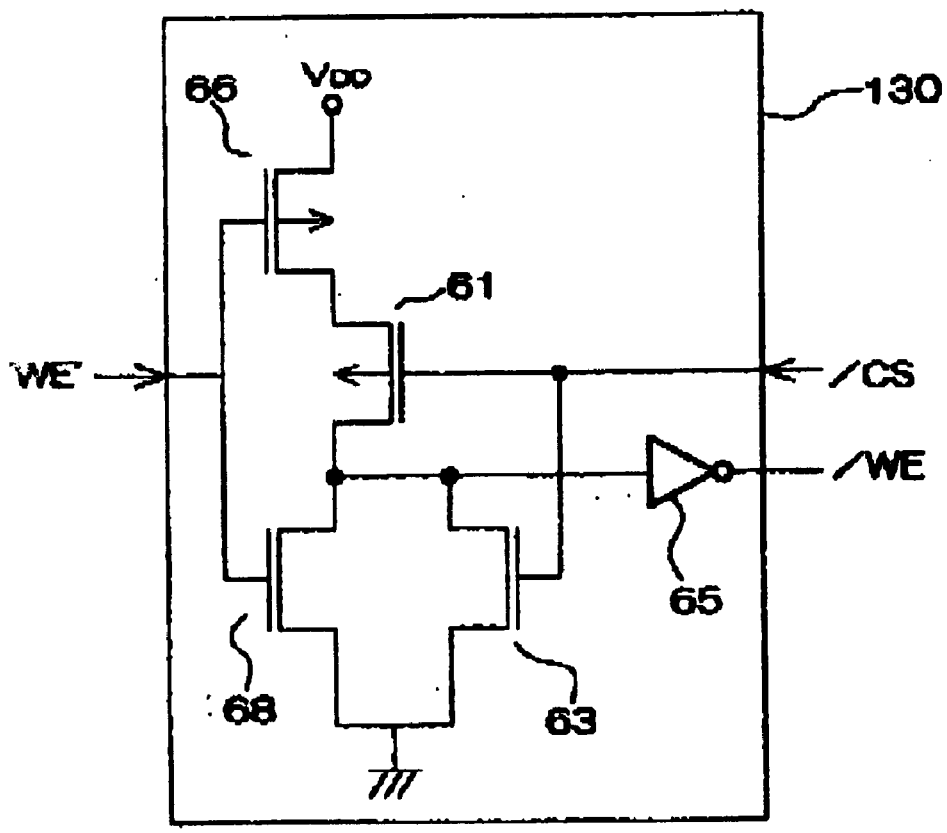
FIG. 13 shows an exemplary circuit block diagram of a WE control that is provided in the semiconductor device in accordance with one embodiment of the present invention.

The WE control 130 is described in detail. FIG. 13 shows a circuit block diagram of the WE control 130. The WE control 130 has the same structure as that of the selection circuit 64-0 shown in FIG. 6. Therefore, components of the WE control 130 that are the same as the components of the selection circuit 64-0 shown in FIG. 6 are referred to by the same reference numbers. Accordingly, description of the circuit components of the WE control 130 is omitted.

During the operation state of the semiconductor device 1, a chip select signal /CS at L level is input in the WE control 130. The signal at L level is applied to gates of a pMOS 61 and an nMOS 63 in the WE control 130. The pMOS 61 turns ON, and the nMOS 63 turns OFF. An externally provided write enable signal WE' is input in a COMS inverter that is formed from a pMOS 66 and a nMOS 68. As described above, the pMOS 61 is ON and the nMOS 63 is OFF. Therefore, the externally provided write enable signal /WE' is inverted by the COMS inverter, further inverted by an inverter 65, and output from the WE control 130 as a write enable signal /WE. In other words, the externally provided write enable signal /WE' is input in the semiconductor device 1, and the semiconductor device 1 becomes write-enabled.

During the standby state or the power-down state of the semiconductor device 1, a chip select signal /CS at H level is input in the WE control 130. The chip select signal at H level is applied to the gates of the pMOS 61 and the nMOS 63. The pMOS 61 turns OFF, and the nMOS 63 turns ON. As a result, a signal at L level is always output from the CMOS inverter (pMOS 66 and nMOS 68) when the externally provided write enable signal /WE is either at L level or H level. In other words, the externally provided write enable signals, WE' are prohibited from entering, the semiconductor device 1. Accordingly, the semiconductor device 1 cannot become write-enabled.

It is noted that the OE control 140 can have the same structure and performs the same operation as those of the WE control 130.

As described above, in accordance with the present embodiment, in the block 22 that is externally accessed, the refresh operation is postponed. In the present embodiment, as shown in FIG. 1, the RF counter control 90 can be provided to securely perform refreshing operations in all of the blocks 22.

The RF counter control 90 generates a count-up signal after completion of refreshing the memory cells that are selected by a word line at the n-th row, in all of the blocks 22. As a result, the count value of the RF counter 100 increase by one, and the RF counter 100 outputs corresponding refresh address signals $RFA_8$–$RFA_{19}$. By the outputs from the RF counter 100, the row pre-decoders 30A–30D supply signals that dive a word line at the (n+1)th row.

Figure 14:
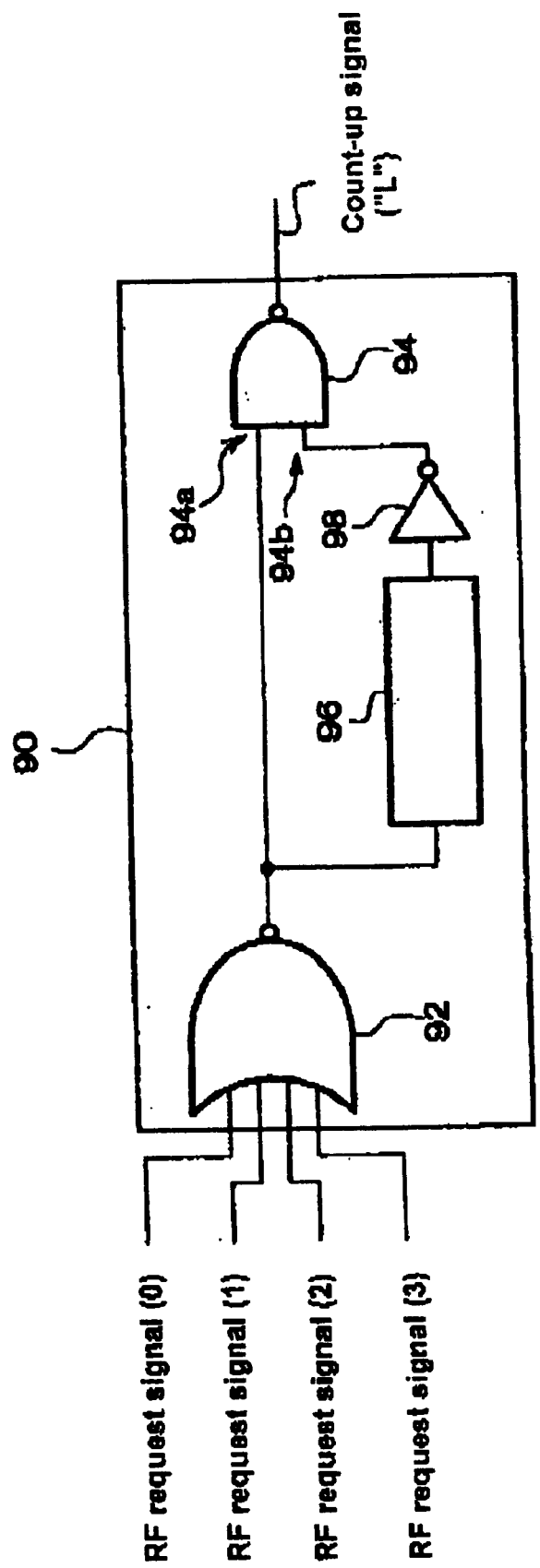
FIG. 14 shows an exemplary circuit block diagram of a RF counter control that is provided in the semiconductor device in accordance with one embodiment of the present invention.

FIG. 14 shows an exemplary circuit block diagram of the RF counter control 90. The RF counter control 90 can be equipped with a NOR gate 92, a NAND gate 94, a delay circuit 96 and an inverter 98.

RF request signals (0)–(3) am input in the NOR gate 92. An output signal from the NOR gate 92 is input in the NAND gate 94, through two paths. One of the paths is a path that directly connects from an output terminal of the NOR gate 92 to an input terminal 94a of the NAND gate 94. The other of the paths is a path that connects from the output terminal of the NOR gate 92 to the input terminal 94a of the NAND gate 94, through the delay circuit 96 and the inverter 98, The NAND gate 94 outputs a count-up signal at Low active.

Figure 15:
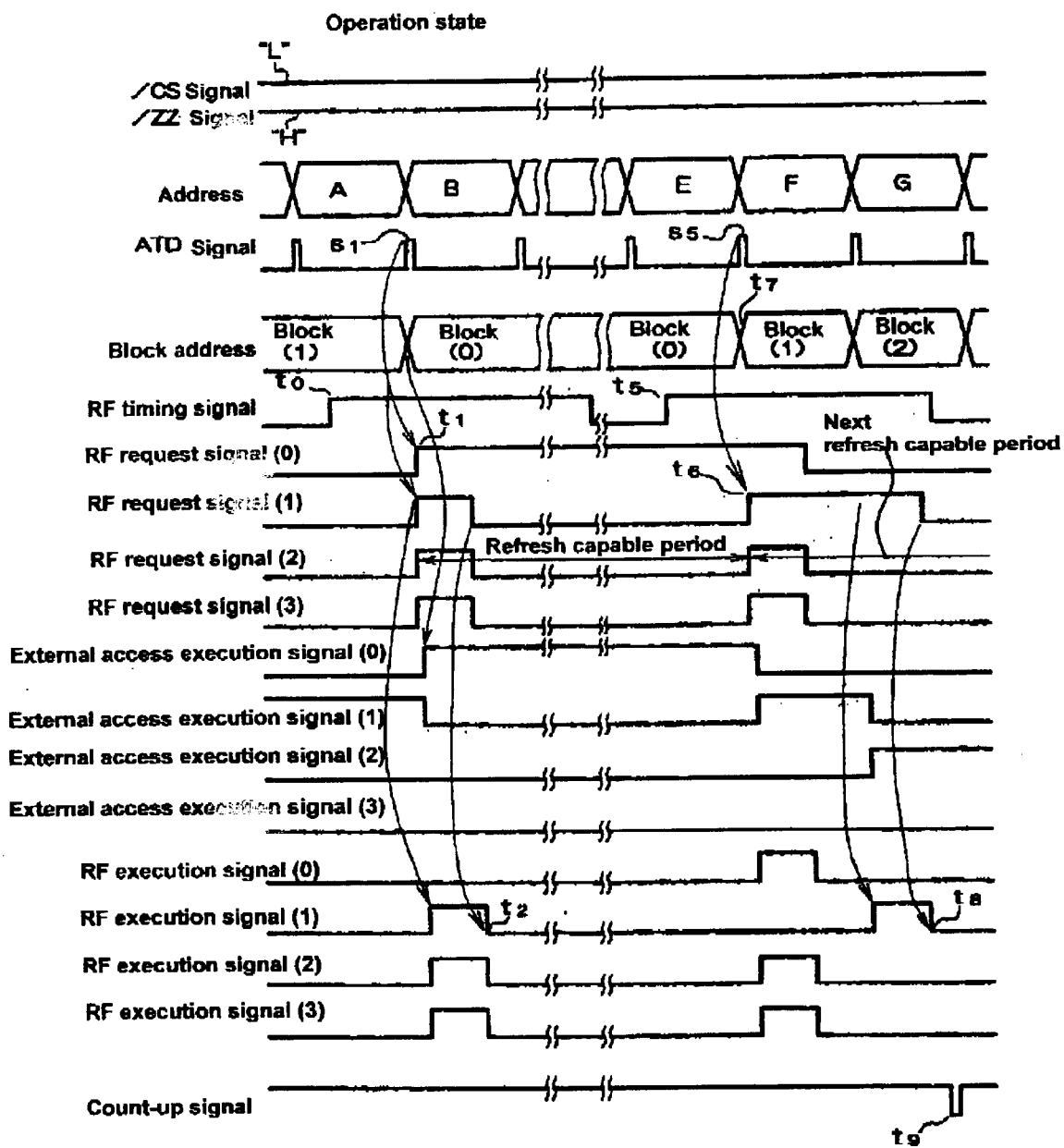
FIG. 15 shows a timing chart of an operation state in one period of the semiconductor device in accordance with one embodiment of the present invention.

An operation in which the RF counter control 90 outputs a count-up signal is described, with reference to FIG. 1, FIG. 14 and FIG. 15. FIG. 15 shows a timing chart of the operation state in one period of the semiconductor device 1. The chip select signal /CS is at L level, and the operation state takes place.

The operation of the semiconductor device 1 from time $t_0$ time $t_0$ is the same as the operation from time $t_0$–time $t_2$ in the timing chart shown in FIG. 3. In other words, memory cells that are selected by the word line in the n-th row are refreshed in the block (1) 22B, the block (2) 22C and the block (3) 22D.

After the next RF timing signal becomes H level (at time $t_5$), the RF request signals (1)–(3) become H level (at time $t_6$) based on the generation of the first ATD signal ($s_5$).

During the period starts at time $t_1$ and ending at time $t_6$ (this period is called a refresh enable period, and one refreshing is possible in each of the blocks during this period), the block (0) 22A is continuously selected. Therefore, memory cells that are selected by the word line at the n-th row in the block (0) 22A are not refreshed (postponement of refreshing in a certain refresh enable period). Therefore, during this refresh enable period, the RF request signal (0) remains to be at H level, and the NOR gate 92 outputs a signal at L level. Accordingly, during the refresh enable period, the NAND gate 94 outputs a signal at H level, such that a count-up signal is not generated.

Accordingly, in the next refresh enable period, memory cells that are also selected by the word line at the same row, namely, at the n-th row in each of the blocks 22 are refreshed. Described in detail, at time $t_6$, the block (1) 22B is selected, such that the external access execution signal (1), and the RF execution signals (0), (2) and (3) become H level. As a result, the memory cells than are selected by the word line at the n-th row are refreshed in the block (0) 22A, the block (2) 22C and the block (3) 22D.

At time $t_7$, the block address changes from the block (1) to the block (2). The RF request signal (1) remains to be at H level, and therefore the RF execution signal (1) changes to H level. By the RF execution signal (1), memory cells that are selected by the word line at the n-th row in the block (1) 22B are refreshed. Then, after a specified time has passed, the RF request signal (1) becomes L level. As a result, the RF execution signal (1) becomes L level, whereby the refreshing is completed (at time $t_8$). By the above operation, refreshing for the memory cells hat are selected by the word line at the n-th row in the blocks (0)–(3) is completed.

At time $t_8$, since the entire RF request signals (0)–(3) become L level, the NOR gate 92 outputs a signal at H level. A signal at H level is immediately input in the input terminal 94a of the NAND gate 94. Since the signal at H level is continuously input in the input terminal 94b, the NAND gate 94 outputs a count-up signal in an active LOW (at L level (at time $t_9$). It is noted that, because the signal at H level output from the NOR gate 92 is passed through the delay circuit 96, inverted by the inverter 98 to become a signal at L level, and input in the input terminal 94b, the signal output from the NAND gate 94 immediately becomes H level.

By the count-up signal, the count value of the RF counter 100 increase by one, and the RF counter 100 outputs corresponding refresh address signals in other words, address signals corresponding to a row to be refreshed next. By the outputs from the RF counter 100, the row pre-decoders 30A–30D that receive inputs of the refresh execution signals supply signals for refreshing memory cells that are selected by the word line at the (n+1)th row to be refreshed next.

In the manner described above, in accordance with the present embodiment, during a certain refresh enable period, until refreshing for memory cells that are selected by the word line at the n-th row is completed, refreshing for memory cells that are selected by the word line at the (n+1)th row is not performed. Accordingly, refreshing for memory cells in the entire rows can be securely performed.

It is noted that, when the RF counter control 90 is provided, the refresh ability value (the time in which a memory cell can retain data) and the refresh cycle number (the number of word lines of each of the blocks 22: 4096 in the present embodiment) must be considered to determine the refresh capable period (the refresh capable period is determined by the RF timing signal and the ATD signal, and the length of the refresh capable period is equal to the cycle of the RF timing signal under a condition in which the ATD signal is generated at a shortest cycle (the shortest cycle in changes among addresses $A_0 \sim A_{19}$). In other words, for example, under a condition where the refresh ability value is 200 ms, and the refresh cycle number is about 4000 (because the number of word lines is 4096), the cycle of the RF timing signal (refresh capable period) assumed to be 50 $\mu$s (50 $\mu$s×4000=200 ms)

Under this condition, if a refreshing is postponed once, data cannot be retained. Therefore, for example, the cycle of the RF timing signal (refresh capable period) is assume to be 45 $\mu$s (45 $\mu$s×4000=180 ms).

If the cycle of the RF timing signal (refresh capable period) is set at 45 $\mu$s, data can be retained even when refreshing can be postponed up to 444 times. ((200 ms−180 ms)÷45 $\mu$s=444 times).

It is noted E as shown in FIG. 15, during the refresh capable period (time $t_1$~time $t_6$), the memory cells that are connected to the word line at the n-th row in the block (0) 22A are not yet refreshed. In the present embodiment, the memory cells that are connected to the word line at the n-th row (the same row) are refreshed in the next refresh capable period (starting at time $t_8$~). However, it is to be understood that the present invention is not limited to this embodiment, and memory cells that are connected to the word line at the (n+1)th row may be refreshed without departing from the spirit and scope of the present invention.

Figure 16:
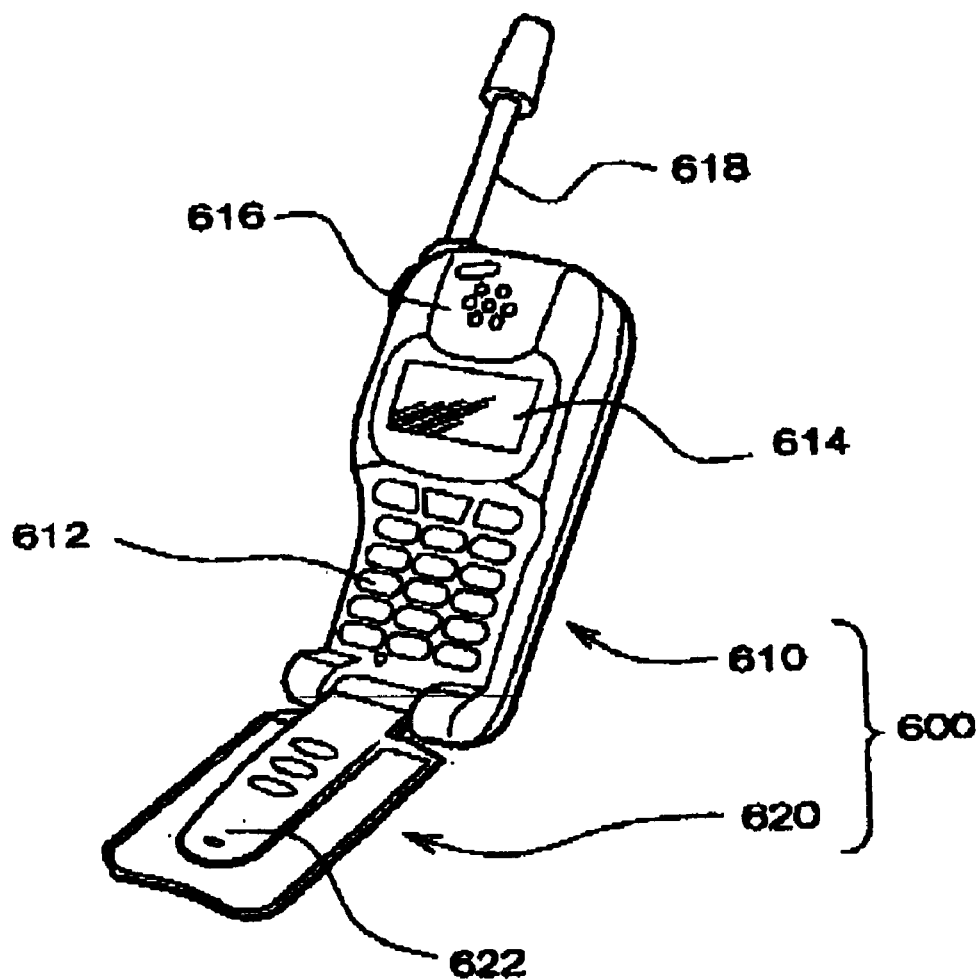
FIG. 16 shows a perspective view of a hand-carry telephone that is equipped with the hand-carry telephone system shown in FIG. 2.

FIG. 16 shows a perspective view of a hand-carry telephone that can incorporate the present invention. For example, FIG. 17 shows a hand-carry telephone 600 that is equipped with the hand-carry telephone system shown in FIG. 2. The hand-carry telephone 600 is equipped with a main body section 610 including a keyboard 612, a liquid crystal display section 614, a telephone receiver section 616 and an antenna section 618, and a lid section 620 including a telephone transmission section 622.

While this invention has been described in conjunction width specific embodiments thereof, it is evident that many alternatives, modifications, and variations will be apparent to those skilled in the art. Accordingly, preferred embodiments of the invention as set for herein are intended to be illustrative not limiting. Various changes may be made without departing from the spirit and scope of the invention.

What is claimed:

1. A method for refreshing a semiconductor device having a memory cell array that is divided in a plurality of blocks, the method comprising:
    an operation step of placing the semiconductor device in an operation state;
    a first detection signal generation step of generating a first detection signal that is a detection signal representative of a change of an address signal of the semiconductor device during the operation state; and
    a first refreshing step of conducting refreshing, based on the first detection signal, for a block among the plurality of blocks other than a block that is externally accessed, wherein the first refreshing step further comprises:
        a first refreshing request step of generating a refreshing request for each of the plurality of blocks based on the first detection signal; and
        a first refresh execution step of conducting refreshing, based on the first refreshing request, for the block among the plurality of blocks other than the block to be accessed.

2. The method for refreshing a semiconductor device according to claim 1, further comprising:
    an external access execution step of externally accessing the block to be eternally accessed, wherein the external access execution step is synchronized with the first refresh execution step based on the first detection signal.

3. The method for refreshing a semiconductor device according to claim 1, wherein the first refresh execution step is completed during a period between generation of the first detection signal and generation of a next detection signal.

4. A method for refreshing a semiconductor device having a memory cell array that is divided in a plurality of blocks, the method comprising:
    an operation step of placing the semiconductor device in an operation state;
    a first detection signal generation step of generating a first detection signal that is a detection signal representative of a change of an address signal of the semiconductor device during the operation state;
    a first refreshing step of conducting refreshing, based on the first detection signal, for a block among the plurality of blocks other than a block that is externally accessed;
    a standby step of placing the semiconductor device in a standby state;
    a second detection signal generation step of generating a second detection signal that is a detection signal representative of a change of an address signal of another semiconductor device; and
    a second refreshing step of conducting refreshing for the plurality of blocks based on the second detection signal.

5. The method for refreshing a semiconductor device according to claim 4, wherein the second detection signal can be generated during a part of the standby state of the semiconductor device.

6. A semiconductor device, comprising:
    a memory cell array that is divided into a plurality of blocks;
    a detection signal generation circuit that generates a first detection signal that is a signal representative of a change of an address signal; and
    a refreshing control circuit that conducts refreshing, based on the first detection signal, for a block among the plurality of blocks other than a block that is externally accessed, wherein the refreshing control circuit further comprises:
        a plurality of refresh request signal generation circuits, each being provided for each of the plurality of blocks for generating a refresh request signal for each of the plurality of blocks; and
        a plurality of block controls, each being provided for each of the plurality of blocks for generating, based on the refresh request signal, a refresh execution signal for a block among the plurality of blocks other than a block to be externally accessed.

7. The semiconductor device according to claim 6, wherein a block control among the plurality of block controls corresponding to the block to be externally accessed generates an external access execution signal for the block to be externally accessed, and the plurality of block controls synchronize, based on the detection signal, generation of the external access execution signal with generation of the refresh execution signal.

8. The semiconductor device according to claim 8, wherein the semiconductor device includes an address buffer that receives an input of the address signal, and an address buffer control circuit that controls the address buffer such that an address signal of another semiconductor device can be input in the semiconductor device during a standby state of the semiconductor device.

9. The semiconductor device according to claim 8, further comprising a refresh timing signal generation circuit that generates a refresh timing signal, wherein each of the plurality of refresh request signal generation circuits generates the refresh request signal based on the refresh timing signal for each of the corresponding plurality of blocks.

10. The semiconductor device according to claim 9, wherein, during the standby state of the semiconductor device, the address buffer control circuit controls the address buffer based on the refresh timing signal that is non-active such that an address signal of the other semiconductor device can be input in the semiconductor device.

11. The semiconductor device according to claim 8, further comprising a block selection signal generation circuit that generates a block selection signal that selects the block to be externally selected for each of the plurality of blocks, wherein the block selection signal generation circuit renders all the block selection signals to be non-active during the standby state of the semiconductor device.

12. A memory system, comprising the semiconductor device as set forth in claim 8, the other semiconductor device that commonly use a bus line for the address signal.

13. An electronic apparatus comprising the semiconductor device as set forth in claim 6.

14. A semiconductor device, comprising:
- a memory cell array that is divided into a plurality of blocks;
- a detection signal generation circuit that generates a detection signal that is a signal representative of a change of an address signal; and
- a refreshing control circuit that conducts refreshing, based on the first detection signal, for a block among the plurality of blocks other than a block that is externally accessed, wherein the semiconductor device is operatively arranged to have a standby state, is operatively arranged to handle a second detection signal that is a detection signal representative of a change of an address signal of another semiconductor device, and operatively arranged to conduct refreshing for the plurality of blocks based on the second detection signal.

15. The device according to claim 14, wherein the second detection signal can be generated during a part of the standby state of the semiconductor device.

* * * * *